(12) United States Patent
Mayuzumi

(10) Patent No.: US 10,868,177 B2
(45) Date of Patent: Dec. 15, 2020

(54) SEMICONDUCTOR DEVICE AND MANUFACTURING METHOD THEREOF

(71) Applicant: Sony Corporation, Tokyo (JP)

(72) Inventor: Satoru Mayuzumi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/146,740

(22) Filed: Sep. 28, 2018

(65) Prior Publication Data

US 2019/0043988 A1   Feb. 7, 2019

Related U.S. Application Data

(63) Continuation of application No. 13/196,170, filed on Aug. 2, 2011.

(30) Foreign Application Priority Data

Aug. 9, 2010 (JP) ................................ 2010-178976

(51) Int. Cl.
*H01L 29/78* (2006.01)
*H01L 29/66* (2006.01)
(Continued)

(52) U.S. Cl.
CPC .... *H01L 29/7848* (2013.01); *H01L 29/66545* (2013.01); *H01L 29/66795* (2013.01);
(Continued)

(58) Field of Classification Search
CPC ........ H01L 21/823462; H01L 29/7856; H01L 29/51
See application file for complete search history.

(56) References Cited

U.S. PATENT DOCUMENTS 6,225,176 B1   5/2001   Yu
6,319,798 B1   11/2001  Yu
(Continued)

FOREIGN PATENT DOCUMENTS

JP   2002-198368   7/2002
JP   2006-013303   1/2006
(Continued)

OTHER PUBLICATIONS

Chinese Office Examination Report issued in connection with related Chinese patent application No. CN 201110219168.8 dated Feb. 25, 2015 with English translation.
(Continued)

*Primary Examiner* — Thao X Le
*Assistant Examiner* — Laura M Dykes
(74) *Attorney, Agent, or Firm* — Michael Best & Friedrich LLP

(57) ABSTRACT

A semiconductor device includes a field effect transistor including: a semiconductor substrate including a channel forming region; a gate insulating film formed at the channel forming region on the semiconductor substrate; a gate electrode formed over the gate insulating film; a first stress application layer formed over the gate electrode and applying stress to the channel forming region; a source/drain region formed on a surface layer portion of the semiconductor substrate at both sides of the gate electrode and the first stress application layer; and a second stress application layer formed over the source/drain region in a region other than at least a region of the first stress application layer and applying stress different from the first stress application layer to the channel forming region.

32 Claims, 31 Drawing Sheets

(51) Int. Cl.
*H01L 29/49* (2006.01)
*H01L 29/51* (2006.01)

(52) U.S. Cl.
CPC ........ *H01L 29/785* (2013.01); *H01L 29/7834* (2013.01); *H01L 29/7843* (2013.01); *H01L 29/49* (2013.01); *H01L 29/51* (2013.01)

(56) References Cited

U.S. PATENT DOCUMENTS

| | | | |
|---|---|---|---|
| 7,259,425 | B2 | 8/2007 | An et al. |
| 2001/0020922 | A1 | 9/2001 | Yamazaki et al. |
| 2005/0072992 | A1 | 4/2005 | Lee et al. |
| 2005/0148137 | A1* | 7/2005 | Brask .............. H01L 21/823821 438/216 |
| 2005/0263832 | A1* | 12/2005 | Chambers ......... H01L 29/66553 257/401 |
| 2006/0046449 | A1 | 3/2006 | Liaw |
| 2006/0160317 | A1 | 7/2006 | Zhu et al. |
| 2007/0040225 | A1 | 2/2007 | Yang |
| 2007/0099360 | A1 | 5/2007 | Lee et al. |
| 2007/0145487 | A1* | 6/2007 | Kavalieros ........ H01L 29/66628 257/368 |
| 2008/0038886 | A1 | 2/2008 | Pei |
| 2008/0050863 | A1 | 2/2008 | Henson et al. |
| 2008/0099858 | A1 | 5/2008 | Kawakita |
| 2008/0150033 | A1 | 6/2008 | Greene et al. |
| 2008/0185617 | A1 | 8/2008 | Kuan et al. |
| 2008/0197412 | A1 | 8/2008 | Zhang et al. |
| 2009/0152623 | A1 | 6/2009 | Goto et al. |
| 2009/0224293 | A1 | 9/2009 | Miyanami |
| 2009/0227079 | A1 | 9/2009 | Iinuma |
| 2009/0261423 | A1 | 10/2009 | Sawada |
| 2011/0156107 | A1* | 6/2011 | Bohr ................ H01L 21/76831 257/288 |
| 2012/0241863 | A1* | 9/2012 | Tsai .................. H01L 29/66795 257/347 |

FOREIGN PATENT DOCUMENTS

| | | |
|---|---|---|
| JP | 2006120718 | 5/2006 |
| JP | 2006-517060 | 7/2006 |
| JP | 2007242737 A | 9/2007 |
| JP | 2007-299951 | 11/2007 |
| JP | 2008-263168 | 10/2008 |
| JP | 2009-099727 | 5/2009 |
| JP | 2009-105155 | 5/2009 |
| JP | 2009-147194 | 7/2009 |
| JP | 2009-152562 | 7/2009 |
| JP | 2009-218266 | 9/2009 |
| JP | 2010-093012 A | 4/2010 |
| JP | 2010-093201 | 4/2010 |
| JP | 2017118134 A | 6/2017 |
| TW | 200947702 A1 | 11/2009 |
| WO | 2008-096587 | 8/2008 |

OTHER PUBLICATIONS

Japanese Office Action dated Feb. 25, 2014 issued in connection with counterpart Japanese Patent Application No. 2010-178976.
Daisuke Kosemura et al., Characterization of Strain in SI for High Performance MOSFETs; Extended Abstracts of the 2007 International Conference on Solid State Devices and Materials;Tsukba; 2007; pp. 300-391.
Masumi Saitoh et al., Three-Dimensional Stress Engineering in FinFETs for Mobility/On-Current Enhancement and Gate Current Reduction; 2008 Symposium on VLSI Technology Digest on Technical Papers.
Scott E. Thompson et al., Uniaxial-Process-Induced Strained-Si: Extending the CMOS Roadmap; IEEE Transactions on Electron Devices; vol. 53, No. 5; May 2006.

* cited by examiner

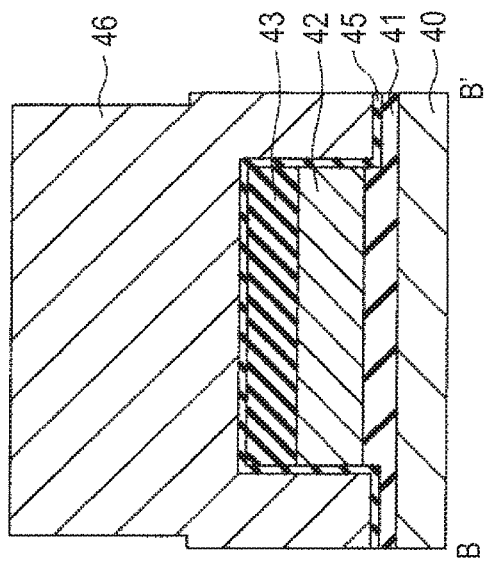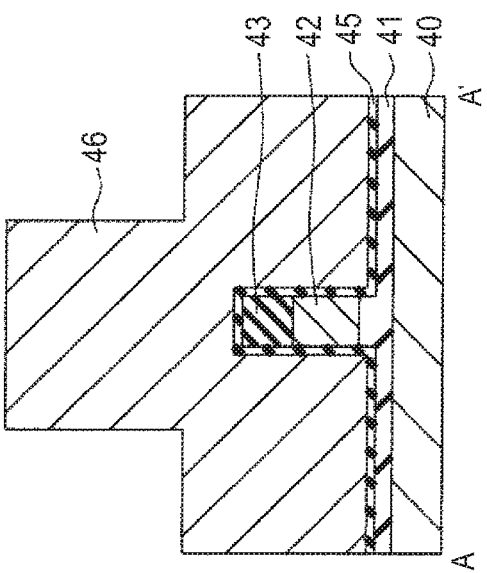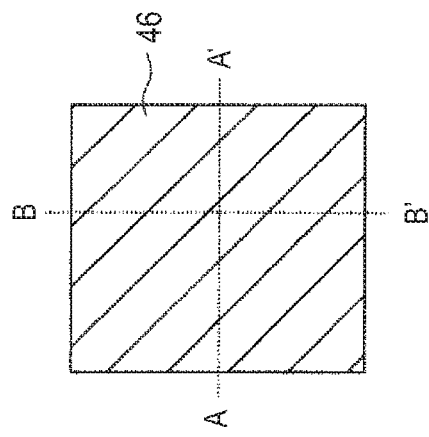

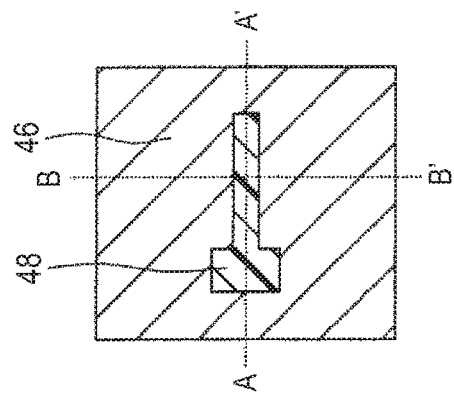
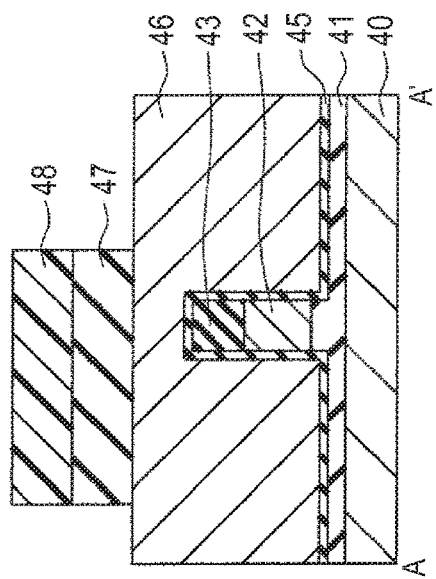
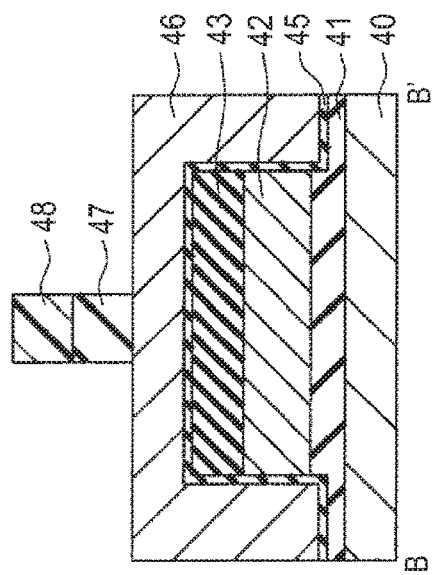

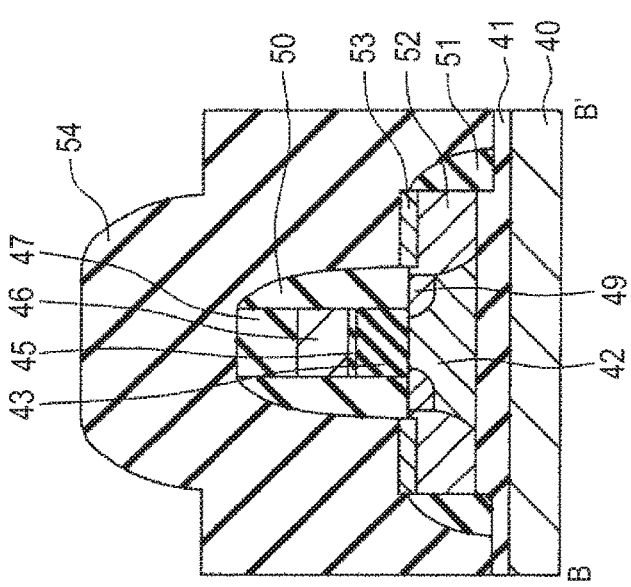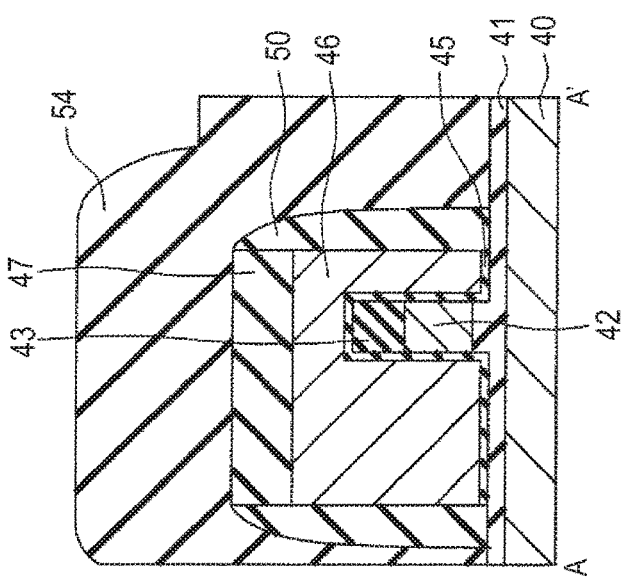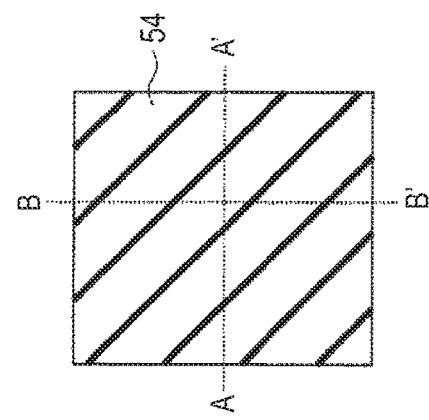

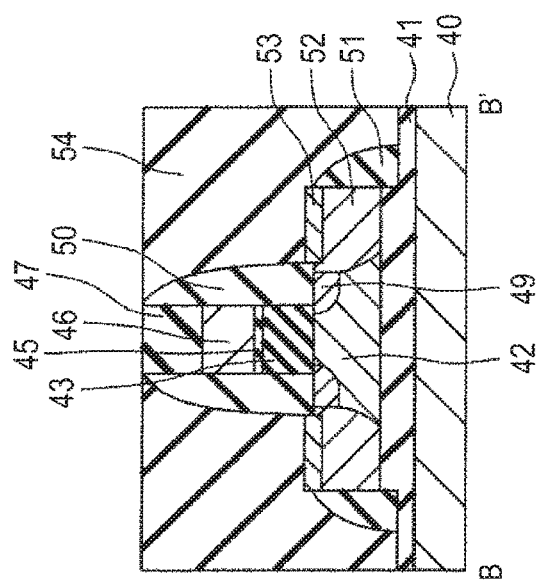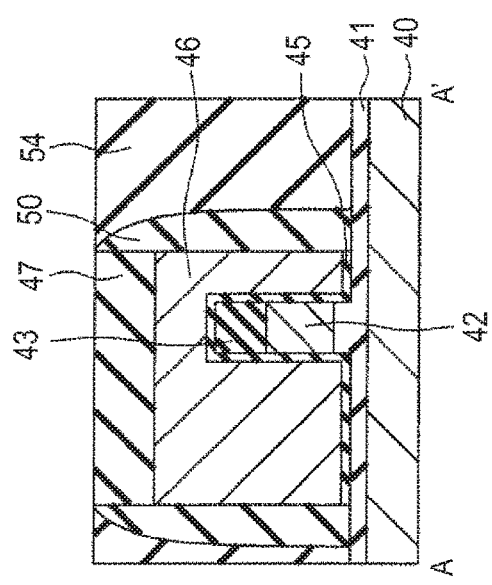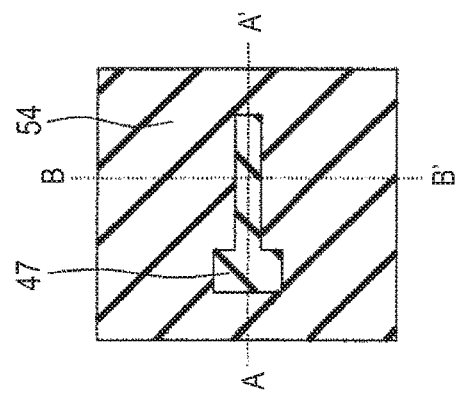

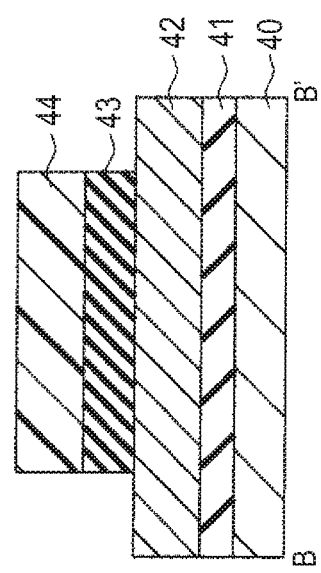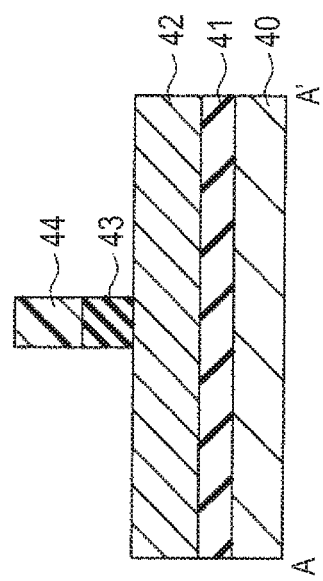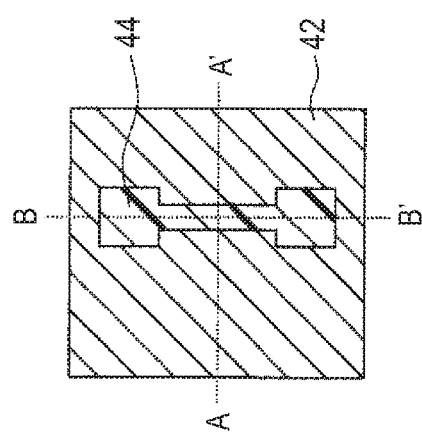

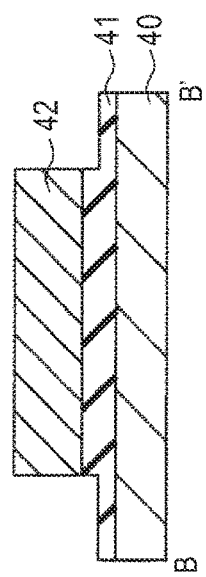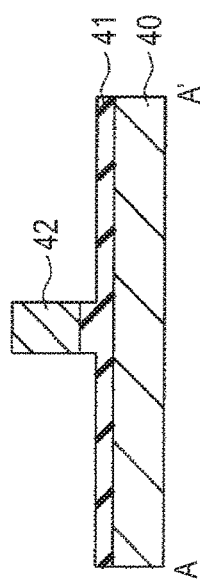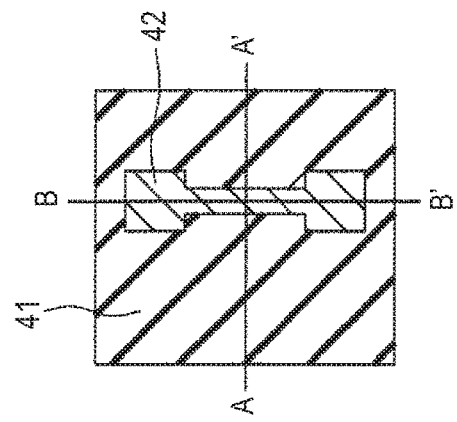

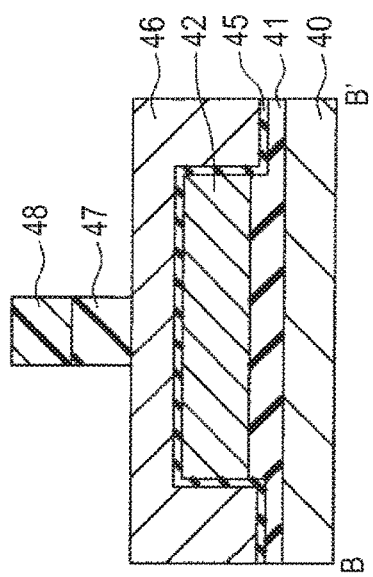
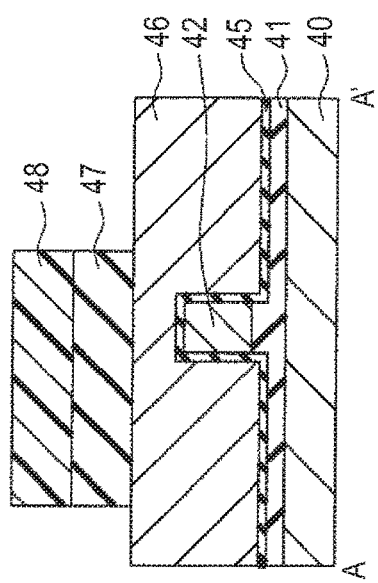
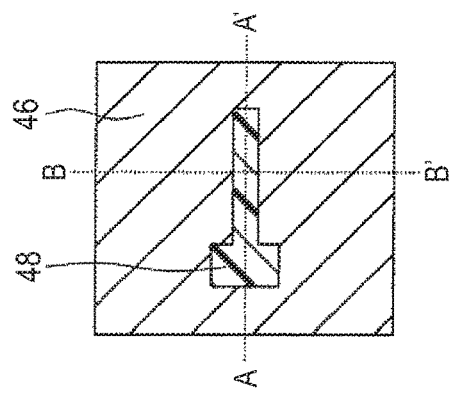

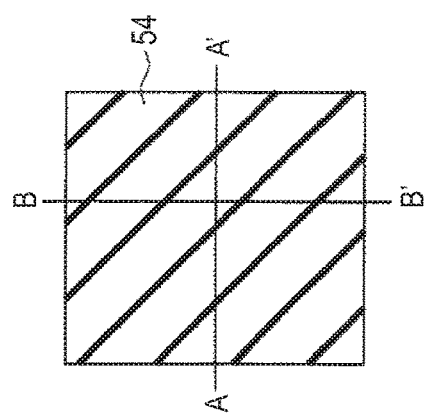
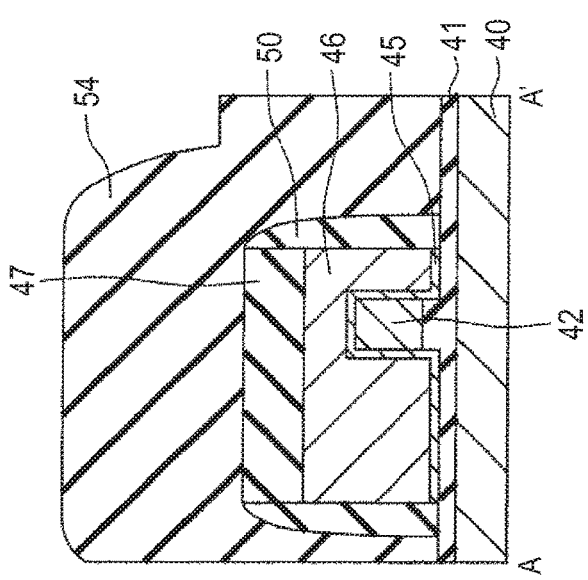
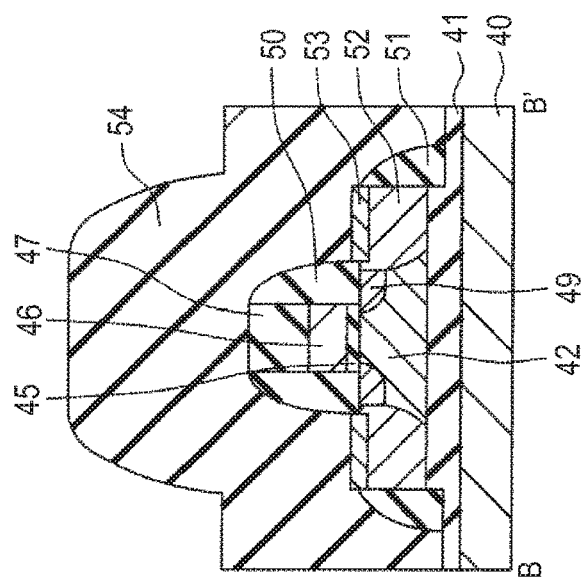

SEMICONDUCTOR DEVICE AND MANUFACTURING METHOD THEREOF

CROSS REFERENCES TO RELATED APPLICATIONS

The present application is a Continuation of application Ser. No. 13/196,170, filed Aug. 2, 2011, which claims priority from Japanese Patent Application 2010-178976, filed Aug. 9, 2010, the entire contents of which being incorporated herein by reference.

FIELD

The present disclosure relates to a semiconductor device and a manufacturing method thereof, and particularly relates to a semiconductor device and a manufacturing method thereof including a metal-insulator (oxide)-semiconductor field effect transistor.

BACKGROUND

A metal-oxide (insulator)-semiconductor field effect transistor (MOSFET or MISFET, hereinafter typically referred to as MOSFET) is a fundamental element of a semiconductor device.

The miniaturization of the MOSFET is further advanced as the miniaturization and high integration of the semiconductor device are proceeding.

A structure in which an n-channel MOSFET (hereinafter also referred to as NTr) and a p-channel MOSFET (hereinafter also referred to as PTr) are included on the same substrate is generally called a CMOS (Complementary MOS) circuit.

The CMOS circuit is widely used as a device having many LSIs because power consumption is low and miniaturization and high integration are easy as well as high-speed operation is possible.

In semiconductor integrated circuits in recent years, a technique of increasing carrier mobility by applying stress to a channel forming region of a transistor using a stress application layer is actively used for improving driving performance of transistors included in the circuit.

Additionally, a fin-type MOSFET in which the shape of the channel forming region has the shape of a fin is known. In addition to the fin-type, the MOSFET having a related-art structure formed on a semiconductor substrate is called a planar type.

The fin-type MOSFET has a structure in which the fin-type channel forming region is sandwiched by a double-gate electrode or a triple-gate electrode, which can realize full depletion and can improve short-channel characteristics and sub-threshold characteristics.

In the recent semiconductor devices, variations occur in the shape of the gate electrode and the gate length after etching as with the reduction of the gate length. In order to improve the above, gate electrode materials are becoming thinner.

Accordingly, in a structure in which the stress application layer is arranged so as to cover the gate electrode as in JP-A-2002-198368 (Patent Document 1), the stress application layer tends to be planarized as the gate electrode becomes thinner.

On the other hand, it is reported that the stress application layer has an effect of localizing the stress to the channel forming region when planarization is lost by the gate electrode or patterning.

Consequently, the stress to be applied from the stress application layer to the channel forming region is reduced as the gate electrode materials are becoming thinner, as a result, effects of improving driving performance of the transistor are reduced.

FIG. 31 is a cross-sectional view of a planar-type MOSFET according to a related art example.

For example, a gate insulating film 120 is formed on a semiconductor substrate 110 made of a silicon substrate and the like.

A gate electrode 121 made of polysilicon and the like is formed over the gate insulating film 120.

A first sidewall insulating film 122 and a second sidewall insulating film 123 made of silicon nitride and so on are formed at both sides of the gate electrode 121.

For example, an extension region 111 extending under the gate electrode 121 is formed on a surface layer portion of the semiconductor substrate 110 at both sides of the gate electrode 121.

Additionally, a source/drain region 112 is formed to be connected to the extension region 111 on the surface layer portion of the semiconductor substrate 110 at both sides of the second sidewall insulating film 123.

On the surface of the gate electrode 121, a high-melting point metal silicide layer 124 such as made of NiSi is formed. Also on the surface of the source/drain region 112, a high-melting point metal silicide layer 113 is formed.

The MOSFET is formed in the manner described above.

For example, a stress application layer 130 made of silicon nitride and the like is formed so as to cover the whole surface of the MOSFET.

An interlayer insulating film 131 made of silicon oxide and the like is formed over the stress application layer 130.

In the above structure, the stress application layer 130 has a shape bending at sides of the gate electrode 121 the second sidewall film 123 arranged at both sides thereof.

The stress is applied to the inside of the semiconductor substrate 110 at the vicinity of an end portion of the gate electrode 121 and carrier mobility is improved due to the above shape.

However, when the gate electrode 121 is made to be thin, the bending degree of the stress application layer 130 is reduced and the stress application layer 130 is planarized.

Therefore, the stress to be applied to the inside of the semiconductor substrate 110 at the vicinity of the end portion of the gate electrode 121 is reduced.

In fin-type MOSFETs having the double-gate electrode or the triple-gate electrode reported in JP-A-2006-13303 (Patent Document 2) and JP-A-2006-517060 (Patent Document 3), improvement in carrier mobility by applying the stress application layer is not realized.

When the stress application layer is applied to the above fin-type MOSFETs so as to cover the gate electrode in the same manner as the planar-type MOSFET shown in FIG. 31, there occurs a problem that the stress to be applied to the fin-type channel is reduced as the gate electrode is made to be thin in the same manner as the above.

The variation of carrier mobility due to the stress application is given by the following expression (1) by using piezoelectric coefficients.

$$\frac{\mu_{xx}}{\mu_0} = 1 + \pi_l S_{xx} + \pi_t S_{yy} + \pi_v S_{zz} \qquad (1)$$

Here, $\mu_{xx}$ represents carrier mobility after the stress application and $\mu_0$ represents carrier mobility before the stress application. $S_{xx}$, $S_{yy}$ and $S_{zz}$ respectively represent stresses applied to a gate length direction (longitudinal direction) L, a gate width direction (transverse direction) T and a direction vertical to the substrate (vertical direction) V. $\Pi_l$, $\Pi_t$ and $\Pi_v$ respectively represent piezoelectric coefficients of the gate length direction (longitudinal direction) L, the gate width direction (transverse direction) T and the direction vertical to the substrate (vertical direction) V.

FIG. 32 and FIG. 33 are schematic perspective views respectively showing directions of the stress in the channel forming regions of the planar-type MOSFET and the fin-type MOSFET.

In FIG. 32, a gate electrode G is formed on a semiconductor substrate SUB through a not-shown gate insulating film, and a source/drain region SD is formed on a surface layer portion of the semiconductor substrate SUB at both sides of the gate electrode G.

In FIG. 33, a gate electrode G is formed so as to cover an upper surface and side surfaces S of a fin-type semiconductor region F through a not-shown gate insulating film, and a source/drain region SD is formed to be connected to the fin-type semiconductor region F at both sides of the gate electrode G.

Table 1 and Table 2 represent respective piezoelectric coefficients in the planer-type MOSFET and the fin-type MOSFET reported in S. E. Thompson et al., "Uniacial-Process-Induced Strained-Si: Extending the CMOS Roadmap", IEEE Trans. Electron. Device, Vol. 53, pp. 1010 (2006) (Non-Patent Document 2) and M. Saitoh et al., "Three-Dimensional Stress Engineering inFinFFTs for Mobility/On-Current Enhancement and Gate Current Reduction", Symp. On VLSI, pp. 18 (2008) (Non-Patent Document 3).

TABLE 1

| | | Plane direction/Channel direction | | |
|---|---|---|---|---|
| | | (100)/<110> | (100)/<100> | (110)/<110> |
| NTr | Longitudinal | 0.355 | 0.386 | — |
| | Transverse | 0.145 | 0.187 | — |
| | Vertical | −0.270 | — | — |
| PTr | Longitudinal | −0.717 | −0.091 | −0.273 |
| | Transverse | 0.338 | 0.062 | 0.051 |
| | Vertical | 0.200 | — | 0.258 |

TABLE 2

| | | Plane direction at side surface portion | |
|---|---|---|---|
| | | (100) | (110) |
| NTr | Longitudinal | −56.1 | −1.2 |
| | Transverse | 50.1 | −15.2 |
| | Vertical | 0.4 | 44.7 |
| PTr | Longitudinal | −45.2 | 45.0 |
| | Transverse | −25.6 | −23.8 |
| | Vertical | 57.6 | −10.1 |

It is found that the sign differs between $\Pi_l$ and $\Pi_v$ according to the channel type, the plane direction and the channel direction from Table 1 and Table 2.

This means that the effect of improving carrier mobility is increased when applying different stresses to the gate length direction (longitudinal direction) L and the direction vertical to the substrate (vertical direction) V.

SUMMARY

In view of the above, it is desirable to improve carrier mobility as compared with related art examples by adjusting combination of stresses to be applied to the channel forming region.

An embodiment of the present disclosure is directed to a semiconductor device having a field effect transistor including a semiconductor substrate including a channel forming region, a gate insulating film formed at the channel forming region on the semiconductor substrate, a gate electrode formed over the gate insulating film, a first stress application layer formed over the gate electrode and applying stress to the channel forming region, a source/drain region formed on a surface layer portion of the semiconductor substrate at both sides of the gate electrode and the first stress application layer, and a second stress application layer formed over the source/drain region in a region other than at least a region of the first stress application layer and applying stress different from the first stress application layer to the channel forming region.

In the semiconductor device according to the embodiment of the present disclosure, the gate insulating film is formed on the semiconductor substrate having the channel forming region, the gate electrode is formed over the gate insulating film and the first stress application layer applying stress to the channel forming region is formed over the gate electrode. The source/drain region is formed on the surface layer portion of the semiconductor substrate at both sides of the gate electrode and the first stress application layer. The second stress application layer applying stress different from the first stress application layer is formed over the source/drain region in the region other than at least the region of the first stress application layer.

Another embodiment of the present disclosure is directed to a manufacturing method of a semiconductor device in which a field effect transistor is formed, which includes forming a gate insulating film on a semiconductor substrate at a channel forming region of the semiconductor substrate including the channel forming region, forming a gate electrode over the gate insulating film, forming a first stress application layer applying stress to the channel forming region over the gate electrode, forming a source/drain region on a surface layer portion of the semiconductor substrate at both sides of the gate electrode and the first stress application layer, forming a second stress application layer applying stress different from the first stress application layer to the channel forming region over the source/drain region in a region other than at least a region of the first stress application layer.

In the manufacturing method of the semiconductor device according to the embodiment, the gate insulating film is formed on the semiconductor substrate at the channel forming region of the semiconductor substrate having the channel forming region.

Next, the gate electrode is formed over the gate insulating film and the first stress application layer applying stress to the channel forming region is formed over the gate electrode.

Next, the source/drain region is formed on the surface layer portion of the semiconductor substrate at both sides of the gate electrode and the first stress application layer.

Next, the second stress application layer applying stress different from the first stress application layer to the channel forming region is formed over the source/drain region in the region other than at least the region of the first stress application layer.

Still another embodiment of the present disclosure is directed to a manufacturing method of a semiconductor device in which a field effect transistor is formed, which includes forming a dummy gate insulating film on a semiconductor substrate at a channel forming region of the semiconductor substrate including the channel forming region, forming a dummy gate electrode over the dummy gate insulating film, forming an offset film over the dummy gate electrode, forming a source/drain region at a surface layer portion of the semiconductor substrate at both sides of the dummy gate electrode and the offset film, forming a second stress application layer applying stress to the channel forming region over the source/drain region in a region other than at least a region of the offset film, forming a trench for a gate electrode by removing the offset film, the dummy gate electrode and the dummy gate insulating film, forming an gate insulating film by covering a bottom surface of the trench for the gate electrode, forming a gate electrode in a height near the middle of the depth of the trench for the gate electrode over the gate insulating film, and forming a first stress application layer applying stress different from the first application layer to the channel forming region by filling the trench for gate electrode over the gate electrode.

In the manufacturing method according to the embodiment of the present disclosure, the dummy gate insulating film is formed on the semiconductor substrate at the channel forming region of the semiconductor substrate having the channel forming region.

Next, the dummy gate electrode is formed over the dummy gate insulating film and the offset film is formed over the dummy gate electrode.

Next, the source/drain region is formed on the surface layer portion of the semiconductor substrate at both sides of the dummy gate electrode and the offset film.

Next, the second stress application layer applying stress to the channel forming region is formed over the source/drain region at the region other than at least the region of the offset film.

Next, the trench for the gate electrode is formed by removing the offset layer, the dummy gate electrode and the dummy gate insulating film.

Next, the gate insulating film is formed by covering the bottom surface of the trench for the gate electrode, and the gate electrode in the height near the middle of the depth of the trench for the gate electrode over the gate insulating film.

Next, the first stress application layer applying stress different from the first application layer to the channel forming region is formed by filling the trench for the gate electrode over the gate electrode.

The field effect transistor is formed in the above manner.

The semiconductor device according to the embodiments of the present disclosure can improve carrier mobility as compared with the related art examples by adjusting combination of stresses to be applied by the first and second stress application layer.

The manufacturing method of the semiconductor device according to the embodiment of the present disclosure can improve carrier mobility as compared with the related art examples by adjusting combination of stresses to be applied by forming the first and second stress application layer.

BRIEF DESCRIPTION OF THE DRAWINGS

FIG. 15A is a plan view showing a manufacturing process in the manufacturing method of the semiconductor device according to the third embodiment of the present disclosure, FIG. 15B is a schematic cross-sectional view taken along A-A' in FIG. 15A and FIG. 15C is a schematic cross-sectional view taken along B-B' in FIG. 15A;

FIG. 16A is a plan view showing a manufacturing process in the manufacturing method of the semiconductor device according to the third embodiment of the present disclosure, FIG. 16B is a schematic cross-sectional view taken along A-A' in FIG. 16A and FIG. 16C is a schematic cross-sectional view taken along B-B' in FIG. 16A;

FIG. 20A is a plan view showing a manufacturing process in the manufacturing method of the semiconductor device according to the third embodiment of the present disclosure, FIG. 20B is a schematic cross-sectional view taken along A-A' in FIG. 20A and FIG. 20C is a schematic cross-sectional view taken along B-B' in FIG. 20A;

FIG. 21A is a plan view showing a manufacturing process in the manufacturing method of the semiconductor device according to the third embodiment of the present disclosure, FIG. 21B is a schematic cross-sectional view taken along A-A' in FIG. 21A and FIG. 21C is a schematic cross-sectional view taken along B-B' in FIG. 21A;

FIG. 23A is a plan view showing a manufacturing process in a manufacturing method of the semiconductor device according to the third embodiment of the present disclosure, FIG. 23B is a schematic cross-sectional view taken along A-A' in FIG. 23A and FIG. 23C is a schematic cross-sectional view taken along B-B' in FIG. 23A;

FIG. 24A is a plan view showing a manufacturing process in the manufacturing method of the semiconductor device according to the third embodiment of the present disclosure, FIG. 24B is a schematic cross-sectional view taken along A-A' in FIG. 24A and FIG. 24C is a schematic cross-sectional view taken along B-B' in FIG. 24A;

FIG. 26A is a plan view showing a manufacturing process in the manufacturing method of the semiconductor device according to the third embodiment of the present disclosure, FIG. 26B is a schematic cross-sectional view taken along A-A' in FIG. 26A and FIG. 26C is a schematic cross-sectional view taken along B-B' in FIG. 26A;

FIG. 29A is a plan view showing a manufacturing process in the manufacturing method of the semiconductor device according to the third embodiment of the present disclosure, FIG. 29B is a schematic cross-sectional view taken along A-A' in FIG. 29A and FIG. 29C is a schematic cross-sectional view taken along B-B' in FIG. 29A;

DETAILED DESCRIPTION

Hereinafter, a semiconductor device and a manufacturing method thereof according to embodiments of the present disclosure will be explained with reference to the drawings.

The explanation will be made in the following order.

1. First Embodiment (Structure in which a gate is formed in a gate first process in a planar-type MOSFET)
2. Second Embodiment (Structure in which a gate is formed in a gate last process in the planar-type MOSFET)
3. First Modification Example (Structure in which high-melting point metal silicidation is performed to an entire gate electrode)
4. Second Modification Example (Structure in which high-melting point metal silicidation is performed to the entire gate electrode)
5. Third Embodiment (Structure in which gate electrodes are included at two planes of a fin-type semiconductor region in a fin-type MOSFET)
6. Fourth Embodiment (Structure in which gate electrodes are included at three planes of the fin-type semiconductor region in a fin-type MOSFET)

1. First Embodiment

[Structure of a Semiconductor Device]

Figure 1:
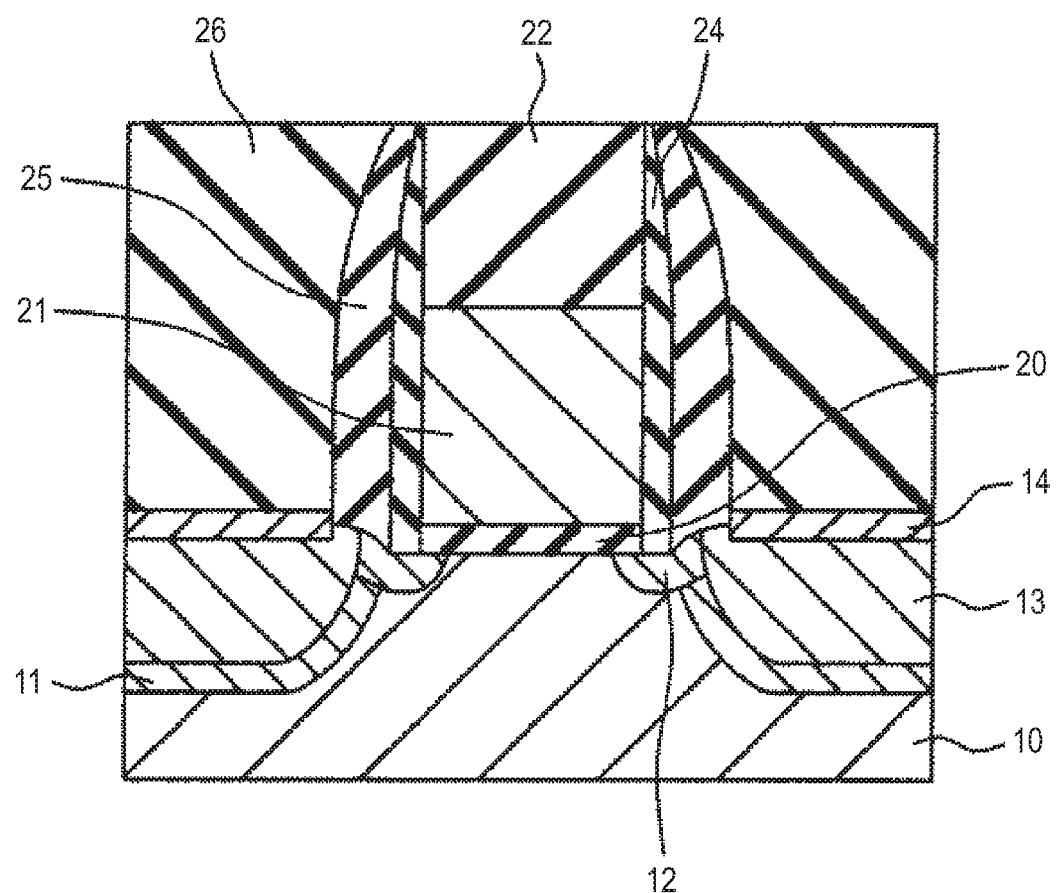
FIG. 1 is a schematic cross-sectional view of a semiconductor device according to a first embodiment of the present disclosure.

FIG. 1 is a schematic cross-sectional view of a semiconductor device according to the embodiment.

For example, a gate insulating film 20 is formed on a semiconductor substrate 10 made of a silicon substrate and the like.

A gate electrode 21 made of polysilicon and the like is formed over the gate insulating film 20.

A first stress application layer 22 is formed over the gate electrode 21.

A first sidewall insulating film 24 and a second sidewall film 25 made of silicon nitride and the like are formed at both sides of the gate electrode 21 and the first stress application layer 22.

For example, an extension region 12 extending under the gate electrode 21 is formed on a surface layer portion of the semiconductor substrate 10 at both sides of the gate electrode 21 and the first stress application layer 22.

Additionally, a source/drain region 13 is formed to be connected to the extension region 12 on the surface layer portion of the semiconductor substrate 10 at both sides of the second sidewall insulating film 25.

On the surface of the source/drain 13, a high-melting point metal silicide layer 14 is formed.

The MOSFET is formed in the manner described above.

A second stress application layer 26 made of silicon nitride and the like is formed so as to cover the MOSFET in a region other than the forming region of the first stress application layer 22. More specifically, the second stress application layer 26 is not formed on the region above the first stress application layer 22, and the second stress application layer 26 is formed at both sides of the first stress application layer 22 and the gate electrode 21.

For example, a not-shown interlayer insulating film made of silicon oxide and so on is formed over the second stress application 26, contact holes with respect to the gate electrode 21 and the source/drain region 13 are opened, contact plugs are buried be connected to an upper wiring.

In the above structure, the first stress application layer 22 is formed over the gate electrode 21. The first stress application layer 22 applies stress to a channel forming region.

On the other hand, the second stress application layer 26 is formed over the source/drain region 13 in the region other than at least the region of the first stress application layer 22.

The second stress application layer 26 applies stress different from the stress of the first stress application layer 22 to the channel forming region.

In a region including part or all of the extension region 12 and the source/drain region 13, a third stress application layer 11 made of SiC, SiGe or the like is formed. The third stress application layer 11 applies stress to the channel forming region.

As the semiconductor substrate 10, for example, a silicon (Si) substrate is used.

As the gate insulating film 20, so-called high dielectric constant (High-k) films such as hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$) and zirconium oxide ($ZrO_2$) having a thickness of approximately 1 to 3 nm can be used. Additionally, silicon oxide ($SiO_2$), oxynitriding silicon (SiON) and the like can be used. Moreover, respective films can be stacked.

As the gate electrode 21, a polysilicon layer, a metal layer and a metal compound layer having a thickness of 30 to 100 nm can be used.

As the metal layer or the metal compound layer, titanium nitride (TiN), titanium (Ti), titanium silicon (TiSi), nickel (Ni), nickel silicon (NiSi), hafnium (Hf), hafnium silicon (HfSi), tungsten (W), tantalum (Ta), tantalum silicon (TaSi), tantalum silicon nitride (TaSiN), cobalt (Co), cobalt silicon (CoSi), ruthenium (Ru), indium (In) and so on can be used.

These films can be stacked for adjusting a threshold voltage or a resistance value.

It is also possible to adjust the threshold voltage by stacking aluminum oxide (AlO), lanthanum oxide (LaO) or the like on the above metal layer or the metal compound layer. Moreover, stress can be applied by the above metal layer or the metal compound layer according to the channel type.

As the first stress application layer 22, for example, silicon nitride can be used to have a film thickness of approximately 30 to 100 nm. A film having compression stress of approximately 2.0 GPa can be used in the case of NTr, and a film having tensile stress of approximately 1.5 Gpa can be used in the case of PTr.

It is also preferable that an insulating film different from the first stress application layer 22 is stacked above or under the first stress application layer 22 though not described in the embodiment.

As the first sidewall insulating film 24 and the second sidewall insulating film 25, the silicon oxide film, the silicon nitride film and the like can be used as a single layer or a stacked layer respectively. These films are formed to have thicknesses of, for example, approximately 2 to 10 nm and 20 to 60 nm, respectively.

Additionally, so-called low dielectric constant (Low-k) films used for a wiring insulating film and the like can be used for reducing gate capacitance.

To the channel forming region and the extension region 12 of the semiconductor substrate 10, a p-type impurity and an n-type impurity are respectively implanted in the case of the NTr, whereas an n-type impurity and a p-type impurity are respectively implanted in the case of the PTr.

For example, phosphorus (P), arsenic (As) or the like is used as the n-type impurity. As the p-type impurity, boron (B), boron fluoride ($BF_2$), indium (In) or the like can be used.

It is also preferable in some cases that an impurity having different conductivity type from the extension region 12 is implanted deeper than the extension region 12. In this case, an impurity profile of the extension region 12 in the depth direction can be sharper.

An impurity having the same conductivity type as the extension region 12 is applied to the source/drain region 13.

In the embodiment, part or all of the extension region 12 and the source/drain region 13 is formed in the third stress application layer 11, however, a structure in which the third stress application layer 11 is not formed can be also applied.

The third stress application layer 11 is made of a compound of carbon (C), germanium (Ge) or the like and silicon, which is formed to have a thickness of approximately 30 to 100 nm. The carbon content and the germanium content can be adjusted according to the stress desired to be applied to the channel forming region of the semiconductor substrate 10.

The high-melting point metal silicide layer 14 is made of, for example, Ti, Co, Ni and Pt or compounds of these materials to have a thickness of approximately 20 to 70 nm.

The second stress application layer 26 is formed so as to cover the second sidewall insulating film 25 and the high-melting point metal silicide layer 14, having a shape being cut at both ends of the first stress application layer 22 and the second sidewall insulating film 25.

The second stress application layer 26 is made of, for example, silicon nitride to have a film thickness of approximately 80 to 200 nm, and a film having tensile stress of approximately 1.6 GPa is used in the case of the NTr and a film having compression stress of approximately 2.0 GPa is used in the case of the PTr.

As described above, the first stress application layer 22 is formed on the gate electrode 21, and the region on the semiconductor substrate 10 other than the region of the first stress application layer 22 is covered with the second stress application layer 26. According to the structure, the second stress application layer 26 has a shape being cut at end portions of the gate.

The first stress application layer 22 and the second stress application layer 26 use materials having different stresses.

According to D. Kosemura et al., "Characterization of Strain for High Performance MOSFETs", SSDM, pp. 390, (2007) (Non-Patent Document 1), it is reported that, when the stress application layer is cut off, the stress is localized on the semiconductor substrate at end portions of the stress application layer which has been cut off.

In the embodiment, the second stress application layer 26 is cut at the end portions of the gate, therefore, the stress can be applied to the channel forming region at the end portions of the gate efficiently.

When the gate electrode becomes thinner, the film thickness of the second stress application layer 26 can be increased by adjusting the film thickness of the first stress application layer 22, therefore, the stress to be applied from the second stress application layer 26 to the channel forming region is not alleviated.

In the semiconductor device according to the embodiment, combination of stresses to be applied is adjusted by using the first and second stress application layers applying different stresses to the channel forming region, thereby improving carrier mobility as compared with the related art examples.

[Manufacturing Method of the Semiconductor Device]

A manufacturing method of the semiconductor device according to the embodiment will be explained with reference to FIGS. 2A to 2C to FIGS. 4A and 4B.

Figure 2A:
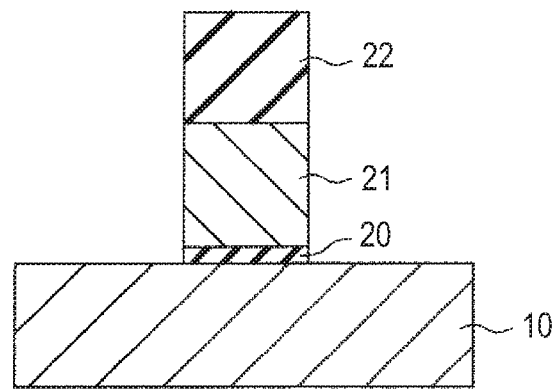
FIGS. 2A to 2C are schematic cross-sectional views showing manufacturing processes in a manufacturing method of a semiconductor device according to the first embodiment of the present disclosure.

First, as shown in FIG. 2A, for example, the gate insulating film 20, the gate electrode 21 and the first stress application layer 22 are stacked on the semiconductor substrate 10.

Next, a resist pattern is formed by using a photolithography technique or an electron-beam lithography technique and dry etching and the like are performed using the resist pattern as a mask to thereby pattern the gate insulating film 20, the gate electrode 21 and the first stress application layer 22.

It is also preferable that an element isolation region is formed in the semiconductor substrate 10 and a well region is formed by implanting an impurity by an ion implantation method before forming the gate insulating film 20 though not clearly shown.

The gate insulating film 20 is formed by using so-called high dielectric constant (High-k) films such as hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$) and zirconium oxide ($ZrO_2$) having a thickness of approximately 1 to 3 nm. Additionally, silicon oxide ($SiO_2$), oxynitriding silicon (SiON) and the like can be used. Moreover, respective films can be stacked. As a method of forming the film, a thermal oxidation process, a chemical vapor deposition (CVD) method, a physical vapor deposition (PVD) method and the like can be used.

The gate electrode 21 can be formed by depositing a polysilicon layer, a metal layer or a metal-compound layer to have a thickness of approximately 50 to 100 nm using, for example, the CVD method, an ALD (Atomic Layer Deposition) method or the PVD method.

As the metal layer or the metal compound layer, titanium nitride (TiN), titanium (Ti), titanium silicon (TiSi), nickel (Ni), nickel silicon (NiSi), hafnium (Hf), hafnium silicon (HfSi), tungsten (W), tantalum (Ta), tantalum silicon (TaSi), tantalum silicon nitride (TaSiN), cobalt (Co), cobalt silicon (CoSi), ruthenium (Ru), indium (In) and so on can be used.

These films can be stacked for adjusting a threshold voltage or a resistance value. It is also possible to stack aluminum oxide (AlO), lanthanum oxide (LaO) or the like on the above metal layer or the metal compound layer.

Moreover, stress can be applied by the above metal layer or the metal compound layer according to the channel type.

As the first stress application layer 22, for example, silicon nitride can be used to have a film thickness of approximately 30 to 100 nm. A film having compression stress of approximately 2.0 GPa can be used in the case of NTr, and a film having tensile stress of approximately 1.5 Gpa can be used in the case of PTr.

Figure 2B:
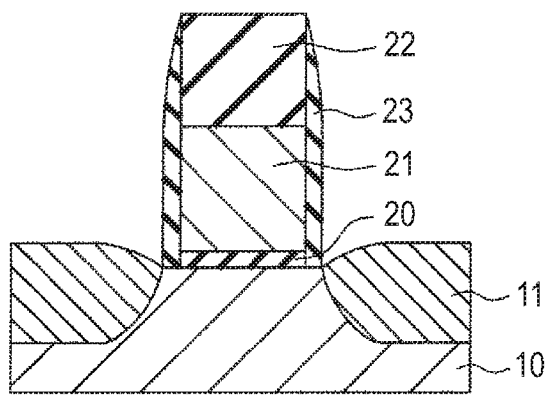

Next, as shown in FIG. 2B, an insulating film is formed on the whole surface of the substrate and recess-etched by a dry etching method and so on, thereby forming a dummy sidewall insulating film 23 only at sidewall portions of the gate insulating film 20, the gate electrode 21 and the first stress application layer 22.

The dummy sidewall insulating film 23 is formed by using, for example, a silicon nitride film, a silicon oxide film, a TEOS film (a silicon oxide film using tetraethylorthosilicate as a source gas) and an NSG film to have a thickness of approximately 50 to 150 nm by the CVD method and the like.

After that, the recess etching is performed on the whole surface by the dry etching method and the like. At this time, a selected ratio of the first stress application layer 22 and the dummy sidewall insulating film 23 is increased with respect to the semiconductor substrate 10, thereby selectively etching the semiconductor substrate 10.

When the element isolation region is formed, a selected ratio with respect to a material of the element isolation region is desirable to be increased as high as possible.

According to the above processes, a groove of approximately 50 to 100 nm is formed on the semiconductor substrate 10.

After that, the third stress application layer 11 is selectively formed in the region of the semiconductor substrate 10 where the etching has been performed. The third stress application layer 11 is formed by using, for example, silicon germanium (SiGe) at the time of applying compression stress and silicon carbide (SiC) at the time of applying tensile stress to have a thickness of approximately 50 to 200 nm by a selective epitaxial growth method.

Furthermore, it is also preferable that an impurity is implanted for forming the source/drain region when forming the third stress application layer 11. For example, an n-type impurity is implanted in the case of the NTr and a p-type impurity is implanted in the case of the PTr.

Figure 2C:
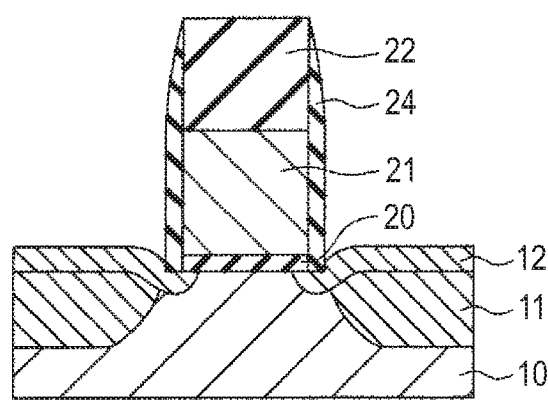

Next, as shown in FIG. 2C, the dummy sidewall insulating film 23 is removed by a wet etching method.

Next, an insulating film is formed on the whole surface of the substrate and recess-etched by the dry etching method and so on, thereby forming the first sidewall insulating film 24 only at sidewall portions of the gate insulating film 20, the gate electrode 21 and the first stress application layer 22.

The first sidewall insulating film 24 is formed by using, for example, the silicon nitride film, the silicon oxide film, the TEOS film and the NSG film to have a thickness of approximately 2 to 10 nm by the CVD method and the like. After that, the recess etching is performed on the whole surface by the dry etching method and the like.

The first sidewall insulating film 24 is formed in the embodiment, however, it is not always necessary to form the film. It is also preferable that the dummy sidewall insulating film 23 is left as it is without being removed and used as the first sidewall insulating film 24.

After that, an impurity is ion-implanted by the ion-implantation method to thereby form the extension region 12.

The extension region 12 is formed by implanting the n-type impurity in the case of the NTr, and by implanting the p-type impurity in the case of the PTr, respectively.

It is also preferable that an impurity having different conductivity type from the extension region 12 is implanted deeper than the extension region 12. In this case, an impurity profile of the extension region 12 in the depth direction can be sharper.

Figure 3A:
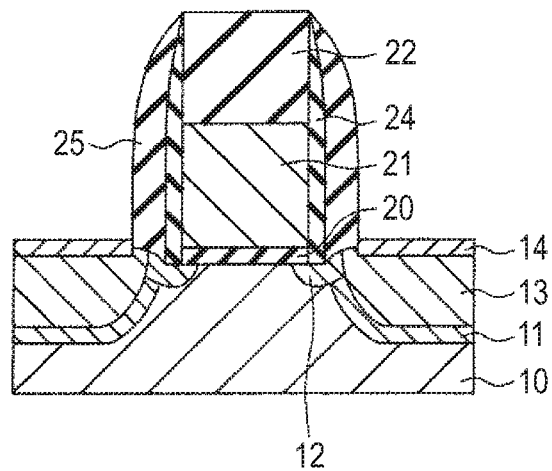
FIGS. 3A and 3B are schematic cross-sectional views showing manufacturing processes in the manufacturing method of the semiconductor device according to the first embodiment of the present disclosure.

Next, as shown in FIG. 3A, an insulating film is formed on the whole surface of the substrate and recess-etched by the dry etching method and so on, thereby forming the second sidewall insulating film 25 only at sidewall portions of the first sidewall insulating film 24.

The second sidewall insulating film 25 is formed by using, for example, the silicon nitride film, the silicon oxide film, the TEOS film and the NSG film to have a thickness of approximately 20 to 60 nm by the CVD method and the like. After that, the recess etching is performed on the whole surface by the dry etching method and the like.

The second sidewall insulating film 25 is formed in a single-layer structure in the embodiment, however, it is also preferable to apply a structure in which plural layers are stacked.

After that, an impurity is ion-implanted by the ion implantation method to thereby form the source/drain region 13.

The source/drain region 13 is formed by using an impurity having the same conductivity type as the extension region 12.

After that, the impurity implanted into the extension region 12 and the source/drain region 13 is activated by annealing treatment. This activation annealing treatment is performed by, for example, rapid thermal annealing at approximately 1000 to 1100° C.

Next, the high-melting point metal silicide layer 14 is formed on the surface of the source/drain region 13 by a salicide process technology. The film is formed by using, for example, Ti, Co, Ni, Pt or compounds of these materials to have a thickness of approximately 20 to 70 nm.

Figure 3B:
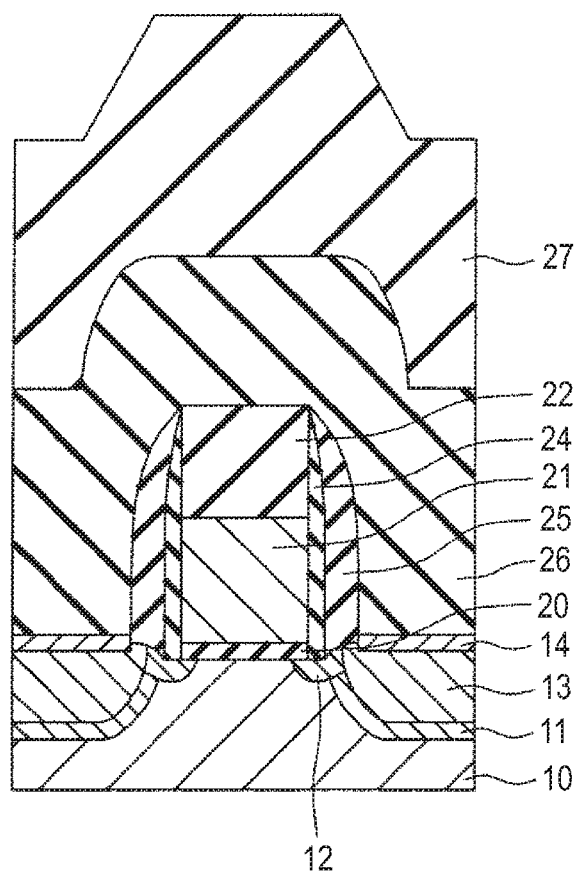

Next, as shown in FIG. 3B, the second stress application layer 26 and an interlayer insulating film 27 are formed on the whole surface of the substrate by using, for example, the CVD method.

As the second stress application layer 26, a film using, for example, silicon nitride is formed to have a thickness of approximately 200 to 300 nm, which has tensile stress or compression stress of approximately 1.5 to 2.0 GPa according to the channel type.

As the interlayer insulation film 27, for example, the TEOS or the NSG film can be used. Moreover, it is also preferable in some cases that only the second stress application layer 26 is formed and the interlayer insulating film 27 is not formed.

Figure 4A:
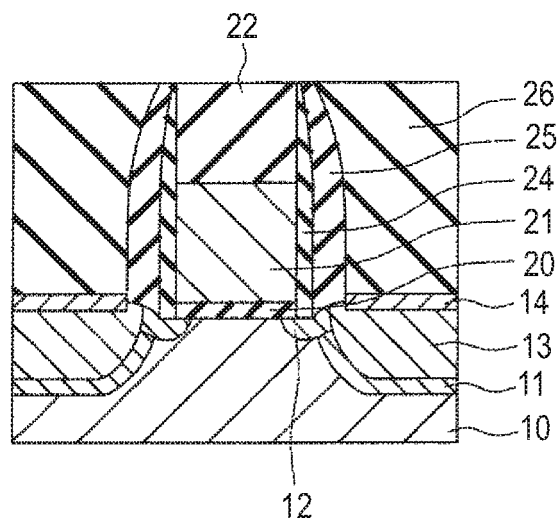
FIGS. 4A and 4B are schematic cross-sectional views showing manufacturing processes in the manufacturing method of the semiconductor device according to the first embodiment of the present disclosure.

Next, as shown in FIG. 4A, the second stress application layer 26 and the interlayer insulating film 27 are removed so that an upper surface portion of the first stress application layer 22 is exposed. These films are polished to be removed by a CMP (chemical mechanical polishing) method, for example.

According to the above processing, the device has a structure in which the second stress application layer 26 is cut at both sides of the first stress application layer 22.

The semiconductor device having the structure shown in FIG. 1 according to the embodiment can be manufactured in the manner described above.

Figure 4B:
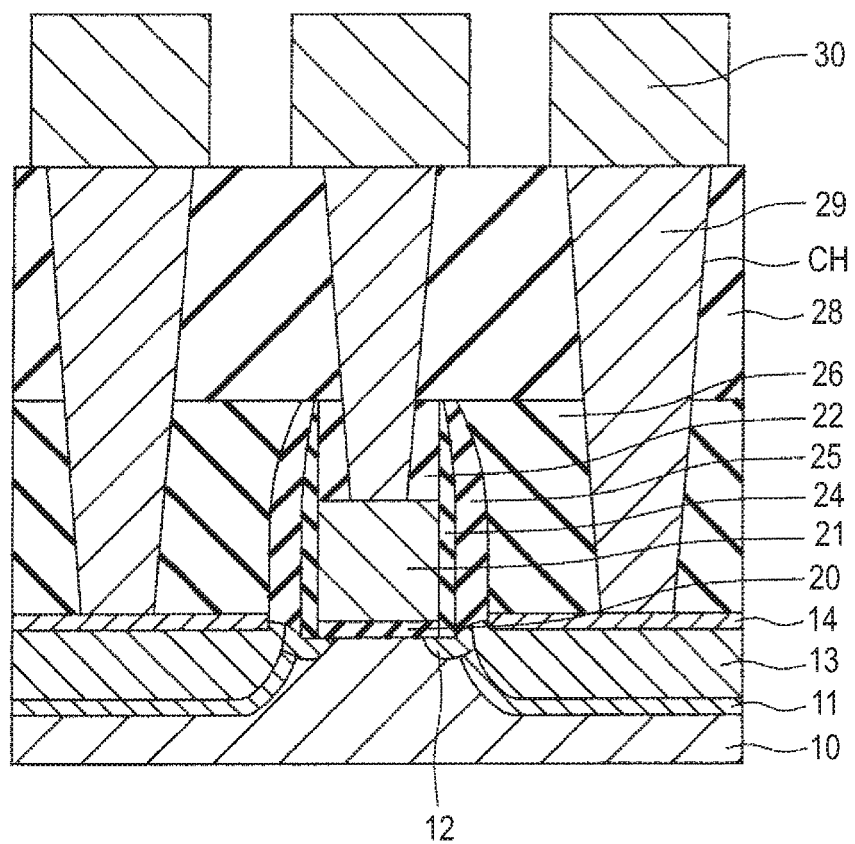

As subsequent processes, a second interlayer insulating film 28 is deposited on the whole substrate, for example, as shown in FIG. 4B, contact holes CH reaching the source/drain regions and the gate electrode are opened and plugs 29 are formed by being buried therein. An upper wiring 30 is formed if necessary.

In the manufacturing method of the semiconductor device according to the embodiment of the present disclosure, combination of stresses to be applied is adjusted by forming the first and second stress application layer, thereby improving carrier mobility as compared with the related art examples.

2. Second Embodiment

[Structure of a Semiconductor Device]

Figure 5:
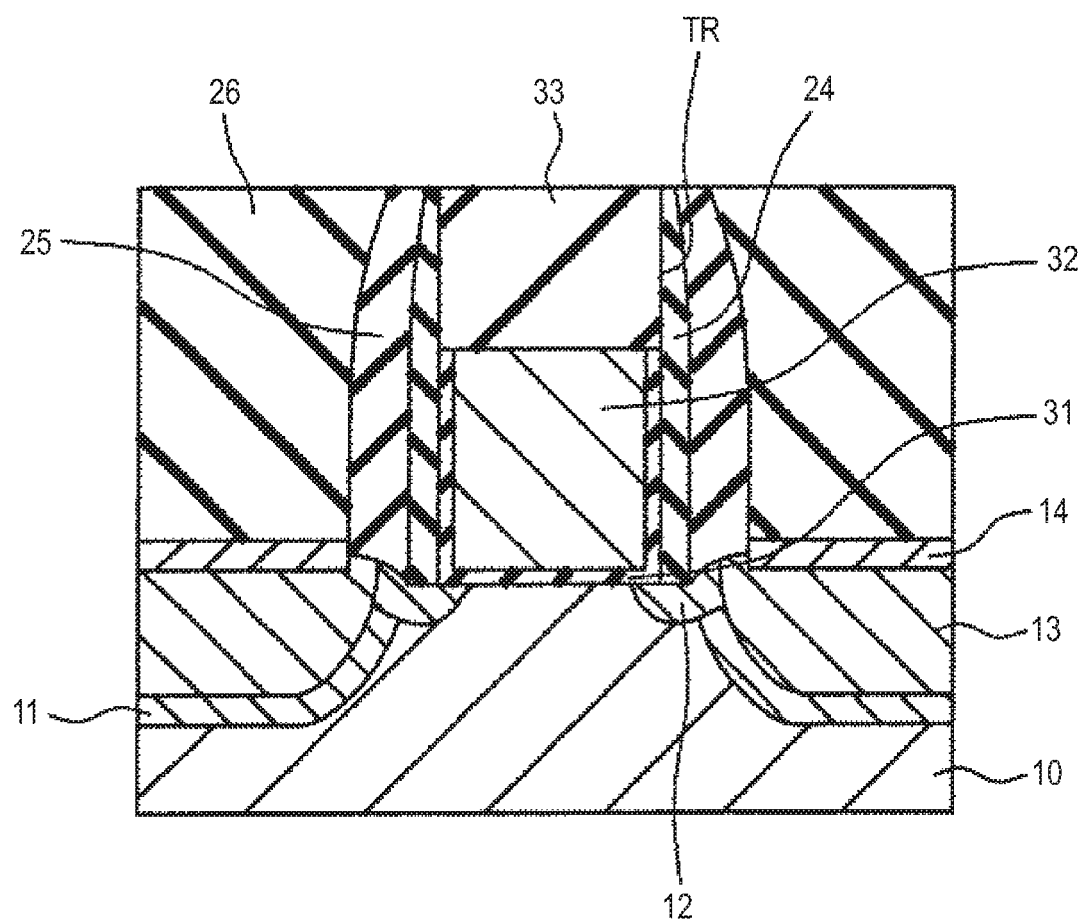
FIG. 5 is a schematic cross-sectional view of a semiconductor device according to a second embodiment of the present disclosure.

FIG. 5 is a schematic cross-sectional view of a semiconductor device according to the embodiment.

The device has substantially the same structure as the first embodiment but is different in the following points.

The gate insulating film 20, the gate electrode 21 and the first stress application layer 22 in the semiconductor device according to the first embodiment are removed and a trench for a gate electrode TR is formed. A gate insulating film 31, a gate electrode 32 and a first stress application layer 33 are embedded inside the trench for the gate electrode TR.

The gate insulating film 31 is formed so as to cover a bottom surface of the trench for the gate electrode TR and a side surface of the trench for the gate electrode TR in a height near the middle of the depth of the trench. The gate electrode 32 is formed to have the height corresponding to the depth of the gate insulating film 31 formed in the trench.

The first stress application layer 33 is formed over the gate electrode 32 so as to fill the trench for the gate electrode TR.

In the semiconductor device according to the embodiment, combination of stresses to be applied is adjusted by using the first and second stress application layer applying different stresses to the channel forming region, thereby improving carrier mobility as compared with the related art examples.

[Manufacturing Method of the Semiconductor Device]

A manufacturing method of the semiconductor device according to the embodiment will be explained with reference to FIGS. 6A to 6C to FIGS. 9A to 9C.

Figure 6A:
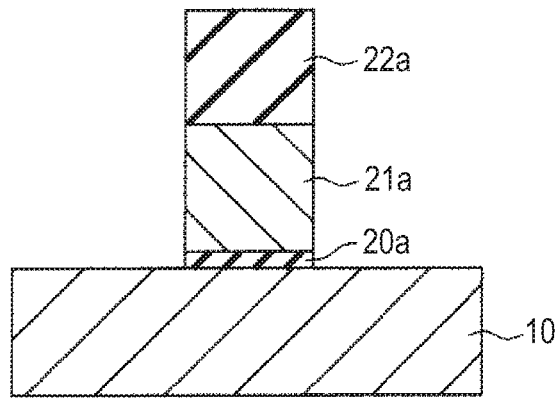
FIGS. 6A to 6C are schematic cross-sectional views showing manufacturing processes in a manufacturing method of a semiconductor device according to a modification example of the second embodiment of the present disclosure.

First, as shown in FIG. 6A, a dummy gate insulating film 20a, a dummy gate electrode 21a and an offset film 22a to be a hard mask are stacked on the semiconductor substrate 10.

Next, a resist pattern is formed by using the photolithography technique or the electron-beam lithography technique and dry etching is performed using the resist pattern as a mask to thereby pattern the dummy gate insulating film 20a, the dummy gate electrode 21a and the offset film 22a. It is also preferable to pattern the offset film 22a by using the resist pattern as a mask and to pattern the dummy gate insulating film 20a and the dummy gate electrode 21a by using the offset film 22a as a hard mask.

It is further preferable that an element isolation region is formed in the semiconductor substrate 10 and a well region is formed by implanting an impurity by an ion implantation method before forming the dummy gate insulating film 20a though not clearly shown.

As the dummy gate insulating film 20a, for example, silicon oxide ($SiO_2$), oxynitriding silicon (SiON) and the like having approximately a thickness of 1 to 3 nm can be used. As a method of forming the film, the thermal oxidation process, the chemical vapor deposition (CVD) method, the physical vapor deposition (PVD) method and the like can be used.

The dummy gate electrode 21a can be formed by stacking a polysilicon layer having a thickness of approximately 30 to 100 nm using, for example, the CVD method or the PVD method.

The offset film 22a is formed by using silicon oxide to have a thickness of approximately 30 to 100 nm, for example, by the CVD method.

Figure 6B:
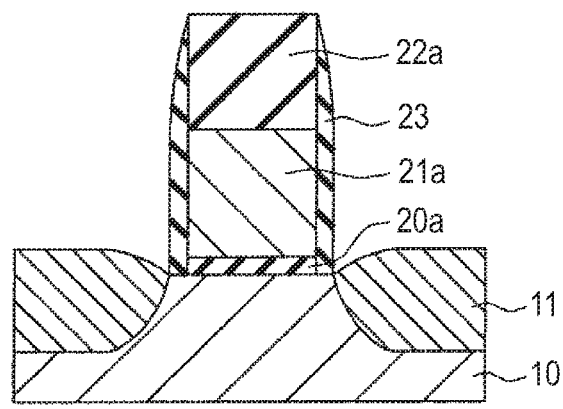

Next, as shown in FIG. 6B, an insulating film is formed on the whole surface of the substrate and recess-etched by the dry etching method and so on, thereby forming the dummy sidewall insulating film 23 only at sidewall portions of the dummy gate insulating film 20a, the dummy gate electrode 21a and the offset film 22a.

The dummy sidewall insulating film 23 is formed by using, for example, the silicon nitride film, the silicon oxide film, the TEOS film (the silicon oxide film using tetraethylorthosilicate as a source gas) and the NSG film to have a thickness of approximately 50 to 150 nm by the CVD method and the like.

After that, the recess etching is performed on the whole surface by the dry etching method and the like. At this time, a selected ratio of the offset film 22a and the dummy sidewall insulating film 23 is increased with respect to the semiconductor substrate 10, thereby selectively etching the semiconductor substrate 10.

When the element isolation region is formed, a selected ratio with respect to a material of the element isolation region is desirable to be increased as high as possible.

According to the above processes, a groove of approximately 50 to 100 nm is formed on the semiconductor substrate 10.

After that, the third stress application layer 11 is selectively formed in the region of the semiconductor substrate 10 where the etching has been performed. The third stress application layer 11 is formed by using, for example, silicon germanium (SiGe) at the time of applying compression stress and silicon carbide (SiC) at the time of applying tensile stress to have a thickness of approximately 50 to 200 nm by the selective epitaxial growth method.

Furthermore, it is also preferable that an impurity is implanted for forming the source/drain region when forming the third stress application layer 11. For example, an n-type impurity is implanted in the case of the NTr and a p-type impurity is implanted in the case of the PTr.

Figure 6C:
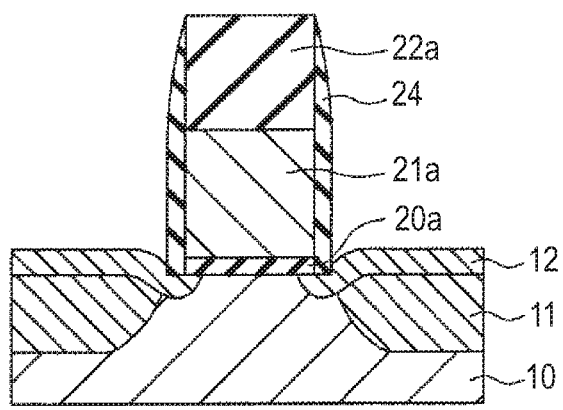

Next, shown in FIG. 6C, the dummy sidewall insulating film 23 is removed by a wet etching method.

Next, an insulating film is formed on the whole surface of the substrate and recess-etched by the dry etching method and so on, thereby forming the first sidewall insulating film 24 only at sidewall portions of the dummy gate insulating film 20a, the dummy gate electrode 21a and the offset film 22a.

The first sidewall insulating film 24 is formed by using, for example, the silicon nitride film, the silicon oxide film, the TEOS film and the NSG film to have a thickness of approximately 2 to 10 nm by the CVD method and the like. After that, the recess etching is performed on the whole surface by the dry etching method and the like.

The first sidewall insulating film 24 is formed in the embodiment, however, it is not always necessary to form the film. It is also preferable that the dummy sidewall insulating film 23 is left as it is without being removed and used as the first sidewall insulating film 24.

After that, an impurity is ion-implanted by the ion-implantation method to thereby form the extension region 12.

The extension region 12 is formed by implanting the n-type impurity in the case of the NTr, and by implanting the p-type impurity in the case of the PTr, respectively.

It is also preferable that an impurity having different conductivity type from the extension region 12 is implanted deeper than the extension region 12. In this case, the impurity profile of the extension region 12 in the depth direction can be sharper.

Figure 7A:
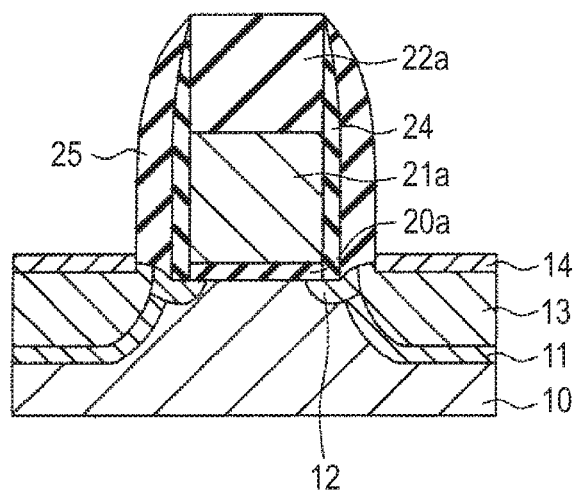
FIGS. 7A and 7B are schematic cross-sectional views showing manufacturing processes in the manufacturing method of the semiconductor device according to the modification example of the second embodiment of the present disclosure.

Next, as shown in FIG. 7A, an insulating film is formed on the whole surface of the substrate and recess-etched by the dry etching method and so on, thereby forming the second sidewall insulating film 25 only at sidewall portions of the first sidewall insulating film 24.

The second sidewall insulating film 25 is formed by using, for example, the silicon nitride film, the silicon oxide film, the TEOS film and the NSG film to have a thickness of approximately 20 to 60 nm by the CVD method and the like. After that, the recess etching is performed on the whole surface by the dry etching method and the like.

The second sidewall insulating film 25 is formed in a single-layer structure in the embodiment, however, it is also preferable to apply a structure in which plural layers are stacked.

After that, an impurity is implanted by the ion implantation method to thereby form the source/drain region 13.

The source/drain region 13 is formed by using the same impurity as the extension region 12.

After that, the impurity implanted into the extension region 12 and the source/drain region 13 is activated by annealing treatment. This activation annealing treatment is performed by, for example, rapid thermal annealing at approximately 1000 to 1100° C.

Next, the high-melting point metal silicide layer 14 is formed on the surface of the source/drain region 13 by the salicide process technology. The film is formed by using, for example, Ti, Co, Ni, Pt or compounds of these materials to have a thickness of approximately 20 to 70 nm.

Figure 7B:
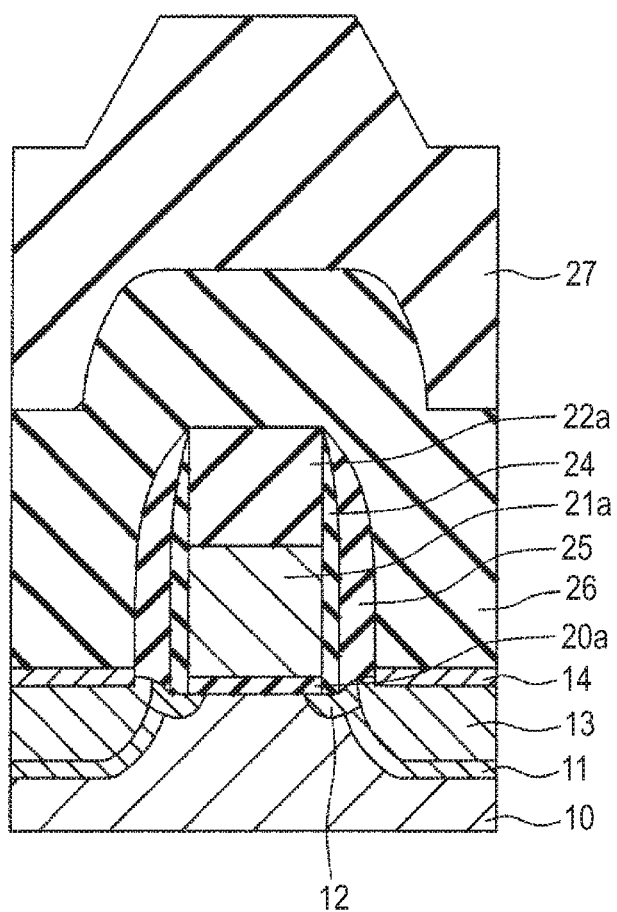

Next, as shown in FIG. 7B, the second stress application layer 26 and an interlayer insulating film 27 are formed on the whole surface of the substrate by using, for example, the CVD method.

As the second stress application layer 26, a film using, for example, silicon nitride is formed to have a thickness of approximately 200 to 300 nm, which has tensile stress or compression stress of approximately 1.5 to 2.0 GPa according to the channel type.

As the interlayer insulation film 27, for example, the TEOS or the NSG film can be used. Moreover, it is also preferable in some cases that only the second stress application layer 26 is formed and the interlayer insulating film 27 is not formed.

Figure 8A:
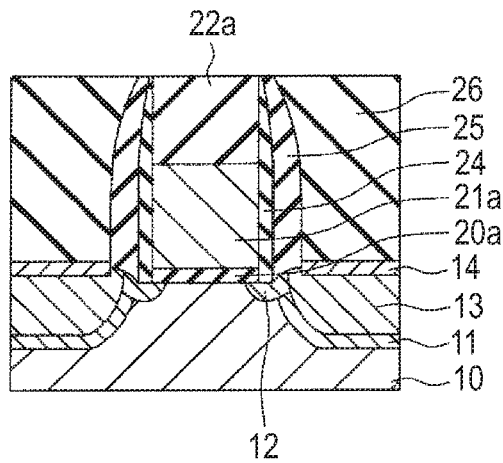
FIGS. 8A to 8C are schematic cross-sectional views showing manufacturing processes in the manufacturing method of the semiconductor device according to the second embodiment of the present disclosure.

Next, as shown in FIG. 8A, the second stress application layer 26 and the interlayer insulating film 27 are removed so that an upper surface portion of the offset film 22a is exposed. These films are polished to be removed by the CMP (chemical mechanical polishing) method, for example.

According to the above processing, the device has a structure in which the second stress application layer 26 is cut at both sides of the offset film 22a.

Figure 8B:
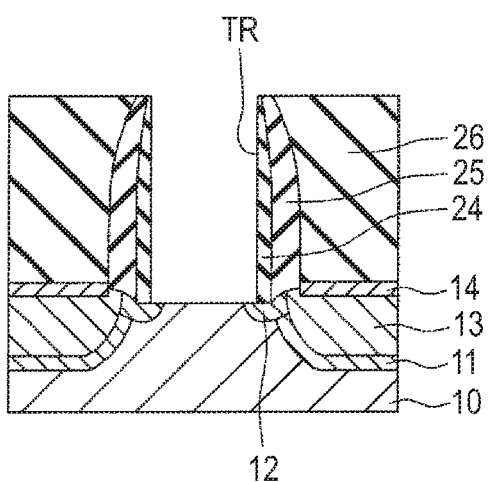

Next, as shown in FIG. 8B, the offset film 22a, the dummy gate electrode 21a and the dummy gate insulating film 20a are removed and the trench for the gate electrode TR is formed.

The dummy gate electrode 21a is selectively removed by using, for example, the dry etching method. The offset film 22a and the dummy gate insulating film 20a are selectively removed by using, for example, the dry etching method or the wet etching method.

Figure 8C:
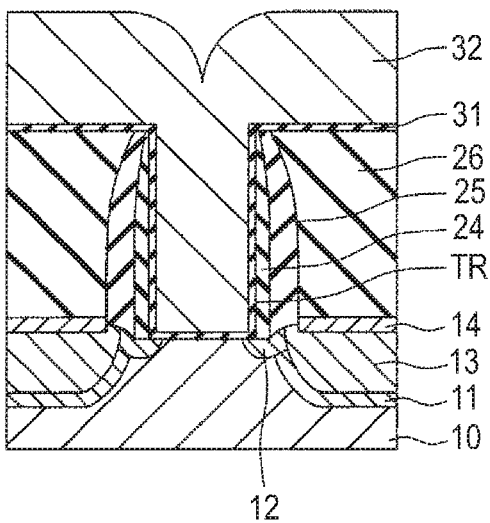

Next, as shown in FIG. 8C, materials for forming the gate insulating film 31 and the gate electrode 32 are deposited on the whole surface of the semiconductor substrate 10 inside the trench for the gate electrode TR.

Here, the gate insulating film 31 is formed by using so-called high dielectric constant (High-k) films such as hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$) and zirconium oxide ($ZrO_2$) having approximately a thickness of 1 to 3 nm. Additionally, silicon oxide ($SiO_2$), oxynitriding silicon (SiON) and the like can be used. Moreover, respective films can be stacked. As a method of forming the film, the ALD method, the CVD method and the like can be used.

The gate electrode 32 can be formed by stacking a polysilicon layer, a metal layer or a metal-compound layer to have a thickness of approximately 50 to 100 nm using, for example, the CVD method, the ALD (Atomic Layer Deposition) method or the PVD method.

As the metal layer or the metal compound layer, titanium nitride (TiN), titanium (Ti), titanium silicon (TiSi), nickel (Ni), nickel silicon (NiSi), hafnium (Hf), hafnium silicon (HfSi), tungsten (W), tantalum (Ta), tantalum silicon (TaSi), tantalum silicon nitride (TaSiN), cobalt (Co), cobalt silicon (CoSi), ruthenium (Ru), indium (In) and so on can be used. As a method of forming the film, the ALD method, the PVD method and the like can be used.

These films can be stacked for adjusting the threshold voltage or the resistance value. It is also possible to stack aluminum oxide (AlO), lanthanum oxide (LaO) or the like on the above metal layer or the metal compound layer. Moreover, stress can be applied by the above metal layer or the metal compound layer according to the channel type.

Figure 9A:
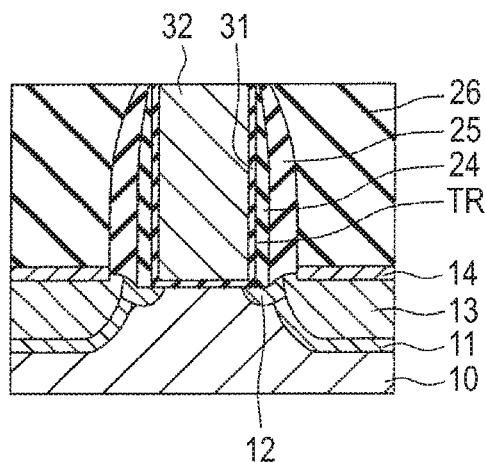
FIGS. 9A to 9C are schematic cross-sectional views showing manufacturing processes in the manufacturing method of the semiconductor device according to the second embodiment of the present disclosure.

As shown in FIG. 9A, materials for the gate insulating film 31 and the gate electrode 32 above the second stress application layer 26 are removed by using the CMP method and the dry etching method.

According to the process, the gate insulating film 31 and the gate electrode 32 are left only inside the trench for the gate electrode TR.

Figure 9B:
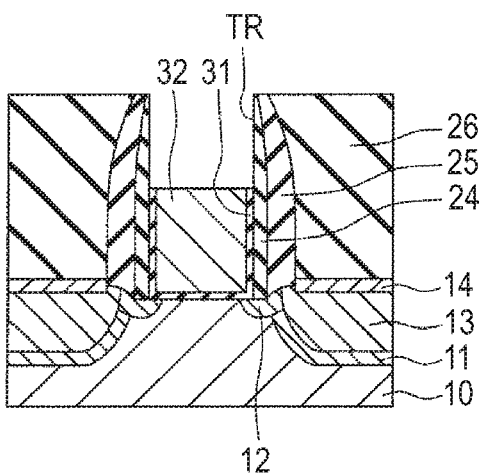

Next, as shown in FIG. 9B, the gate insulating film 31 and the gate electrode 32 inside the trench for the gate electrode TR are selectively removed to be the height of approximately the half of the depth of the trench for the gate electrode TR.

At this time, it is necessary to increase the selected ratio between the second stress application layer 26, the first sidewall insulating film 24, the second sidewall insulating film 25 and the gate insulating film 31, the gate electrode 32.

Figure 9C:
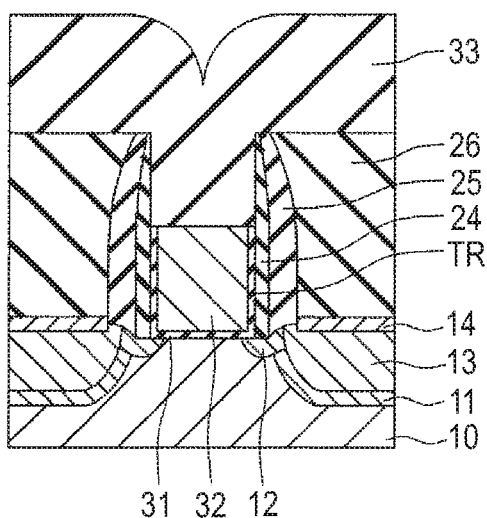

Next, as shown in FIG. 9C, the first stress application layer 33 is deposited so as to cover upper portions of the gate electrode 32 inside the trench for the gate electrode TR and the second stress application layer 26.

As the first application layer 33, a film using, for example, silicon nitride is formed to have a thickness of approximately 50 to 150 nm, which has tensile stress or compression stress of approximately 1.5 to 2.0 GPa according to the channel type. The film applies a different stress from the second stress application layer 26.

Next, the first stress application layer 33 on the second stress application layer 26 is removed by using the CMP method.

It is necessary to adjust the film thickness and the stress of respective materials shown in the embodiment according to transistor characteristics to be formed and the stress to be applied to the semiconductor substrate, therefore, they are not limited to the above.

The semiconductor device having the structure shown in FIG. 5 according to the embodiment can be formed in the manner described above.

Though the gate insulating film is formed a new after removing the dummy gate insulating film in the above manufacturing method, it is not limited to this and the dummy gate insulating film can be directly used without being removed.

As subsequent processes, the second interlayer insulating film is deposited on the whole substrate, contact holes reaching the source/drain region and the gate electrode are opened and plugs are formed by being buried therein. The upper wiring is formed if necessary.

In the manufacturing method of the semiconductor device according to the embodiment of the present disclosure, combination of stresses to be applied is adjusted by forming the first and second stress application layer, thereby improving carrier mobility as compared with the related art examples.

3. First Modification Example

Figure 10:
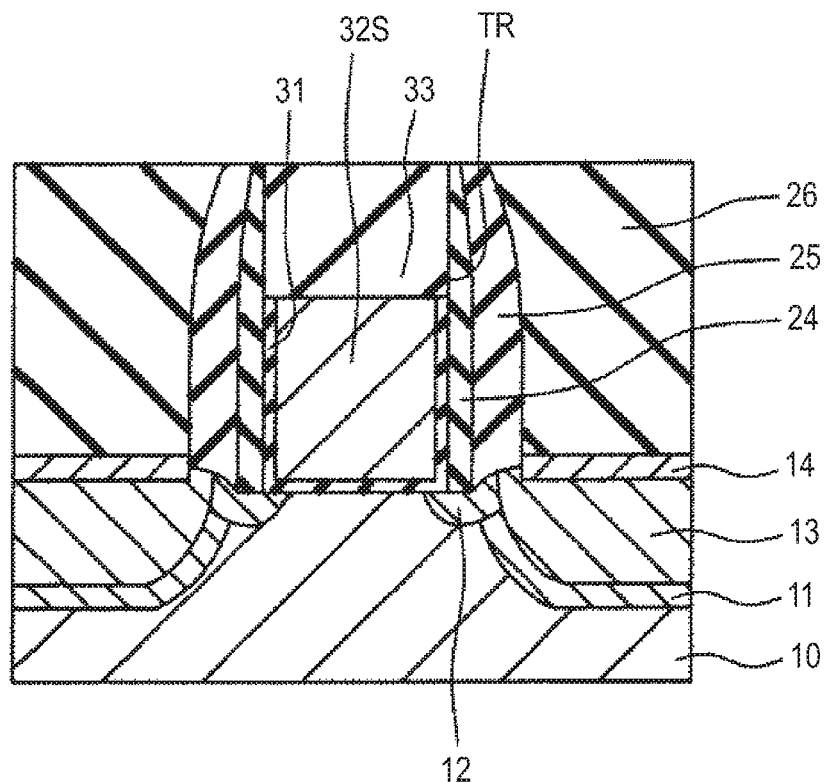
FIG. 10 is a schematic cross-sectional view of a semiconductor device according to a first modification example of the present disclosure.

FIG. 10 is a schematic cross-sectional view of a semiconductor device according to the modification example.

The device has substantially the same structure as the second embodiment but is different in a point that the gate electrode includes a gate electrode 32s entirely made of a high-melting point metal silicide.

As a manufacturing method of the semiconductor device according to the modification example, silicidation is performed to the electrode 32 after forming the device in the same manner as the second embodiment until the process of FIG. 9B is completed.

Subsequent processes can be performed in the same manner as the second embodiment.

4. Second Modification Example

Figure 11:
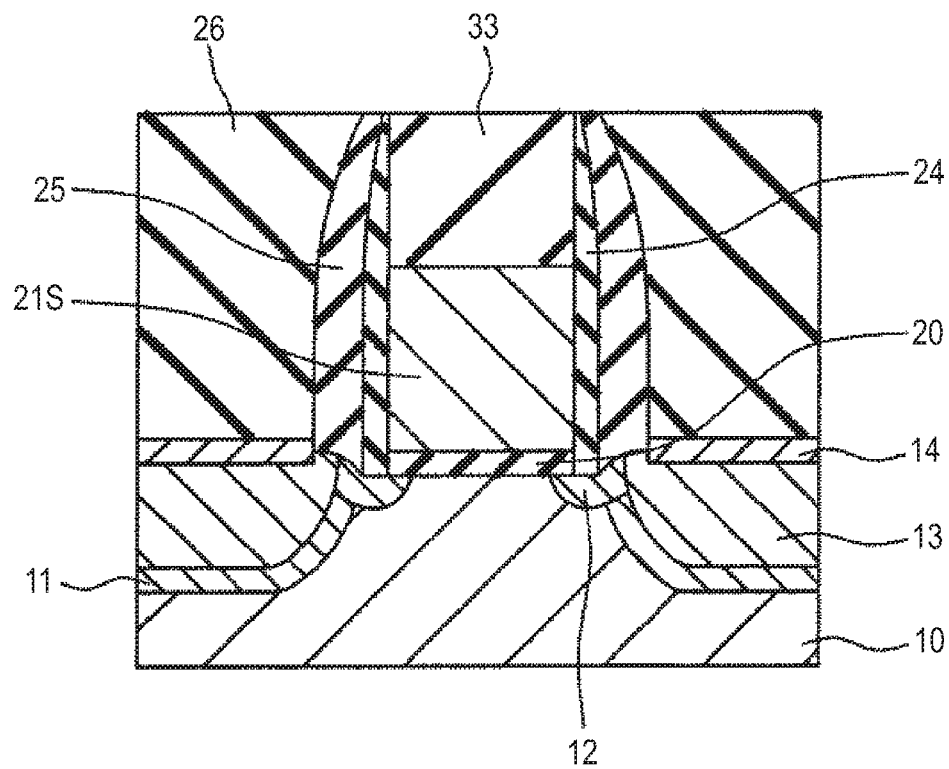
FIG. 11 is a schematic cross-sectional view of a semiconductor device according to a second modification example of the present disclosure.

FIG. 11 is a schematic cross-sectional view of a semiconductor device according to the modification example.

The device has substantially the same structure as the second embodiment but is different in a point that the gate electrode includes a gate electrode 21s entirely made of a high-melting point metal silicide.

As a manufacturing method of the semiconductor device according to the modification example, the offset film 22a is removed and silicidation is performed to the dummy gate electrode after forming the device in the same manner as the second embodiment until the process of FIG. 8A is completed.

The obtained dummy gate electrode 21a to which silicidation has been performed is directly used as the gate electrode. The dummy gate insulating film is directly used as the gate insulating film.

Subsequent processes can be performed in the same manner as the second embodiment.

5. Third Embodiment

[Structure of a Semiconductor Device]

Figure 12A:
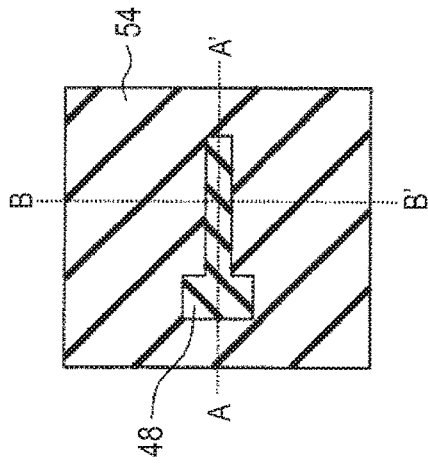
FIG. 12A is a plan view of a semiconductor device according to a third embodiment of the present disclosure.
Figure 12B:
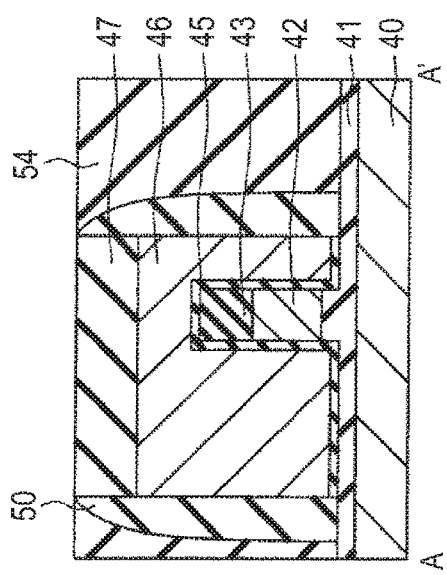
FIG. 12B is a schematic cross-sectional view taken along A-A' in FIG. 12A
Figure 12C:
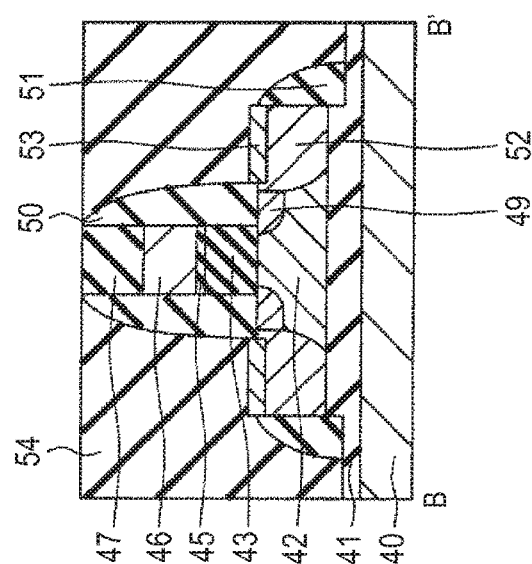
FIG. 12C is a schematic cross-sectional view taken along B-B' in FIG. 12A.

FIG. 12A is a plan view of a semiconductor device according to the embodiment, FIG. 12B is a schematic cross-sectional view taken along A-A' in FIG. 12A and FIG. 12C is a schematic cross-sectional view taken along B-B' in FIG. 12A.

A buried insulating film 41 is formed on a semiconductor substrate 40. A semiconductor region 42 having a fin-type channel forming region and a hard mask 43 are formed over the buried insulating film 41.

For example, the semiconductor substrate 40 is a silicon substrate and the buried insulating film 41 is formed by using silicon oxide having a thickness of approximately 50 to 100 nm.

The fin-type semiconductor region 42 and the hard mask 43 are formed by using silicon having a thickness of approximately 30 to 80 nm and silicon nitride having a thickness of 50 nm.

The fin-type semiconductor region 42 is a convex semiconductor region protruding from a main surface of the semiconductor substrate 40, in which the channel forming region is formed on the semiconductor region 42.

The fin-type semiconductor region 42 is formed on the buried insulating film 41 in this case, however, it is also preferable to apply a structure in which the buried insulating film 41 is not formed and the semiconductor substrate 40 is directly connected to the fin-type semiconductor region 42.

A gate insulating film 45 and a gate electrode 46 are formed so as to cover the buried insulating film 41, the fin-type semiconductor region 42 and the hard mask 43.

The gate insulating film 45 is formed by using so-called high dielectric constant (High-k) films such as hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$) and zirconium oxide ($ZrO_2$) having a thickness of approximately 1 to 3 nm. Additionally, silicon oxide ($SiO_2$), oxynitriding silicon (SiON) and the like can be used. Moreover, respective films can be stacked.

The device has a structure in which the fin-type channel forming region is sandwiched by a double-gate electrode.

The gate electrode 46 is formed by using, for example, a polysilicon layer, a metal layer and a metal compound layer. As the metal layer or the metal compound layer, titanium nitride (TiN), titanium (Ti), titanium silicon (TiSi), nickel (Ni), nickel silicon (NiSi), hafnium (Hf), hafnium silicon (HfSi), tungsten (W), tantalum (Ta), tantalum silicon (TaSi), tantalum silicon nitride (TaSiN), cobalt (Co), cobalt silicon (CoSi), ruthenium (Ru), indium (In) and so on can be used.

These films can be stacked for adjusting the threshold voltage or the resistance value.

The aluminum oxide (AlO), lanthanum oxide (LaO) or the like can be stacked on the above metal layer or the metal compound layer. Moreover, stress can be applied by the above metal layer or the metal compound layer according to the channel type.

An upper surface of the buried insulating film 41 existing in a region where the fin-type semiconductor region 42 is not formed is formed to be lower than a bottom surface of the fin-type semiconductor region 42.

Therefore, sidewall surfaces of the fin-type semiconductor region 42 are fully covered by the gate insulating film 45 and the gate electrode 46.

A first stress application layer 47 is formed on top of the gate electrode 46. As the first stress application layer 47, for example, silicon nitride having a film thickness of approximately 30 to 100 nm is used. A film having compression stress of approximately 1.0 GPa or tensile stress of approximately 1.5 GPa can be used according to the channel type of the fin-type MOSFET.

Sidewall insulating films 50, 51 are formed at sidewall portions of the gate insulating film 45, the gate electrode 46 and the first stress application layer 47.

As the sidewall insulating films 50, 51, for example, the silicon oxide film, the silicon nitride film and so on can be used as a single layer or by stacking plural layers, which are formed to have thicknesses of approximately 20 to 100 nm.

Additionally, so-called low dielectric constant (Low-k) films used for the wiring insulating film and the like can be used for reducing gate capacitance.

A second stress application layer 54 is formed on side surfaces of the sidewall insulating films 50, 51 and an upper surface portion of the second stress application layer 54 is at the same height as an upper surface portion of the first stress application layer 47.

Additionally, the second stress application layer 54 is separated at both ends of the sidewall insulating film 50. More specifically, the second stress application layer 54 is not formed on an upper region of the first stress application layer 47, and the second stress application layer 54 is formed at both sides of the first stress application layer 47 and the gate electrode 46.

The MOSFET of the semiconductor device according to the embodiment is the fin-type MOSFET.

In the semiconductor device according to the embodiment, combination of stresses to be applied is adjusted by using the first and second stress application layer applying different stresses to the channel forming region, thereby improving carrier mobility as compared with the related art examples.

[Manufacturing Method of the Semiconductor Device]

A manufacturing method of the semiconductor device according to the embodiment will be explained with reference to FIGS. 13A to 13C to FIGS. 21A to 21C.

Figure 13A:
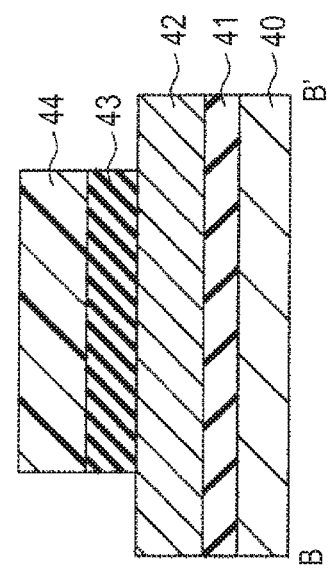
FIG. 13A is a plan view showing a manufacturing process in a manufacturing method of the semiconductor device according to the third embodiment of the present disclosure.
Figure 13B:
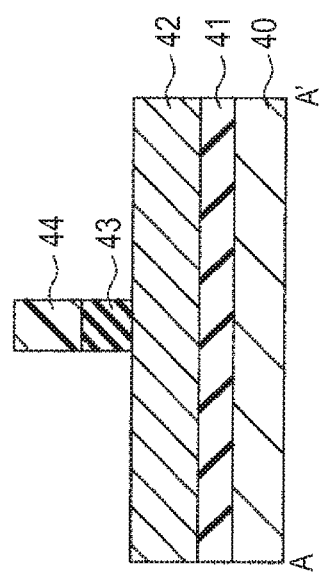
FIG. 13B is a schematic cross-sectional view taken along A-A' in FIG. 13A
Figure 13C:
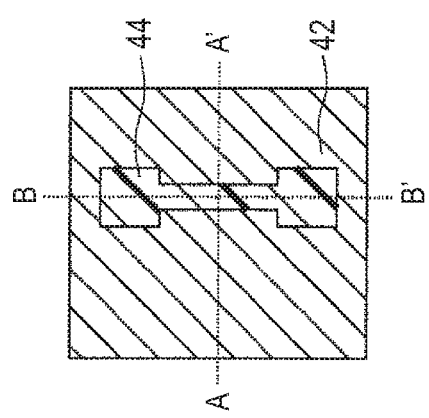
FIG. 13C is a schematic cross-sectional view taken along B-B' in FIG. 13A.

FIG. 13A is a plan view showing a manufacturing process in the manufacturing method of the semiconductor device according to the embodiment, FIG. 13B is a schematic cross-sectional view taken along A-A' in FIG. 13A and FIG. 13C is a schematic cross-sectional view taken along B-B' in FIG. 13A.

The hard mask 43 is deposited on a SOI (Silicon On Insulator) substrate having three-layer structure of the semiconductor substrate 40, the buried insulation film 41 and the semiconductor region 42. After that, a resist film 44 is formed by using the photolithography technique or the electron-beam lithography technique.

Next, etching is performed by using the resist film 44 as a mask by the dry etching method and so on to perform pattern etching of the hard mask 43.

At this time, for example, the silicon substrate is used as the semiconductor substrate 40 and silicon oxide having a thickness of approximately 50 to 100 nm is used as the buried insulating film 41.

Additionally, a silicon layer having a thickness of 30 to 80 nm is used as the semiconductor region 42. As the hard mask 43, for example, silicon nitride having a film thickness of approximately 50 nm is used.

Figure 14A:
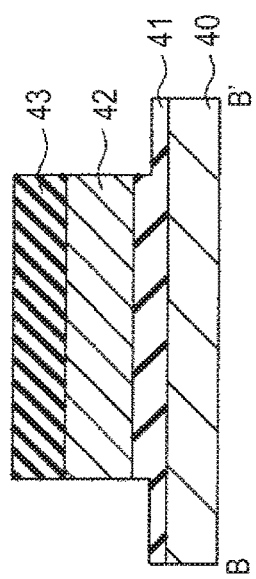
FIG. 14A is a plan view showing a manufacturing process in the manufacturing method of the semiconductor device according to the third embodiment of the present disclosure.
Figure 14B:
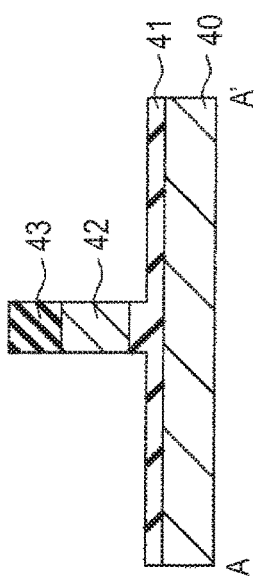
FIG. 14B is a schematic cross-sectional view taken along A-A' in FIG. 14A
Figure 14C:
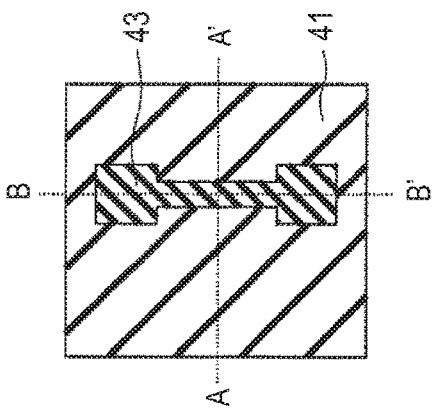
FIG. 14C is a schematic cross-sectional view taken along B-B' in FIG. 14A.

FIG. 14A is a plan view showing a process subsequent to the process shown in FIGS. 13A to 13C, FIG. 14B is a schematic cross-sectional view taken along A-A' in FIG. 14A and FIG. 14C is a schematic cross-sectional view taken along B-B' in FIG. 14A.

After the resist film 44 is removed, the semiconductor region 42 is etched by using the hard mask 43 by dry etching processing.

At this time, part of the buried insulating film 41 is also etched at the same time to thereby form a structure in which the buried insulating film 41 is recessed at end portions of the fin-type semiconductor region 42.

According to the above, the fin-type semiconductor region 42 has a convex shape protruding from the main surface of the semiconductor substrate 40.

Though the fin-type semiconductor region 42 is formed by using the SOI substrate in the embodiment, there is a method not using the SOI substrate. For example, the hard mask 43 and the resist film 44 are formed on the semiconductor substrate 40, and the fin-type semiconductor region is directly formed. An insulating film such as silicon oxide is deposited on the whole surface of the semiconductor substrate 40 with a film thickness to be the same as or higher than the upper surface of the hard mask 43. After that, the insulating film is removed to reach the upper surface of the hard mask 43 by using the CMP method, then, the insulating film is selectively etched by using the dry etching method, thereby forming the silicon oxide film only in a region where the fin-type semiconductor region is not formed on the semiconductor substrate 40.

FIG. 15A is a plan view showing a process subsequent to the process shown in FIGS. 14A to 14C, FIG. 15B is a schematic cross-sectional view taken along A-A' in FIG. 15A and FIG. 15C is a schematic cross-sectional view taken along B-B' in FIG. 15A.

The gate insulating film 45 and the gate electrode 46 are deposited on the whole surface of the semiconductor substrate 40.

Here, the gate insulating film 45 is formed by using so-called high dielectric constant (High-k) films such as hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$) and zirconium oxide ($ZrO_2$) having a thickness of approximately 1 to 3 nm. Additionally, silicon oxide ($SiO_2$), oxynitriding silicon (SiON) and the like can be used. Moreover, respective films can be stacked. As a method of forming the film, the ALD method, the CVD method and the like can be used.

The gate electrode 46 is formed by depositing, for example, a silicon layer, a metal layer of a metal compound layer having a thickness of approximately 50 to 100 nm by using the CVD method, the ALD method and the PVD method.

As the metal layer or the metal compound layer, titanium nitride (TiN), titanium (Ti), titanium silicon (TiSi), nickel (Ni), nickel silicon (NiSi), hafnium (Hf), hafnium silicon (HfSi), tungsten (W), tantalum (Ta), tantalum silicon (TaSi), tantalum silicon nitride (TaSiN), cobalt (Co), cobalt silicon (CoSi), ruthenium (Ru), indium (In) and so on can be used. A method of forming the film, the ALD method, the PVD method and so on can be used.

These films can be stacked for adjusting a threshold voltage or a resistance value. It is also possible to stack aluminum oxide (AlO), lanthanum oxide (LaO) or the like on the above metal layer or the metal compound layer. Moreover, stress can be applied by the above metal layer or the metal compound layer according to the channel type.

FIG. 16A is a plan view showing a process subsequent to the process shown in FIGS. 15A to 15C, FIG. 16B is a schematic cross-sectional view taken along A-A' in FIG. 16A and FIG. 16C is a schematic cross-sectional view taken along B-B' in FIG. 16A.

The CMP processing is performed from the upper surface of the gate electrode 46 to process the gate electrode 46 to have a given film thickness.

Next, the first stress application layer 47 is formed on the gate electrode 46, then, a resist film 48 is formed by using the photolithography technique or the electron-beam lithography technique.

The etching processing such as the dry etching method by using the resist film 48 as a mask by the dry etching method and so on to thereby etch the first stress application layer 47.

Here, as the first stress application layer 47, for example, silicon nitride having a film thickness of approximately 30 to 100 nm can be used.

A film having compression stress of approximately 2.0 GPa or tensile stress of approximately 1.5 Gpa can be used according to the channel type of the fin-type MOSFET.

Figure 17A:
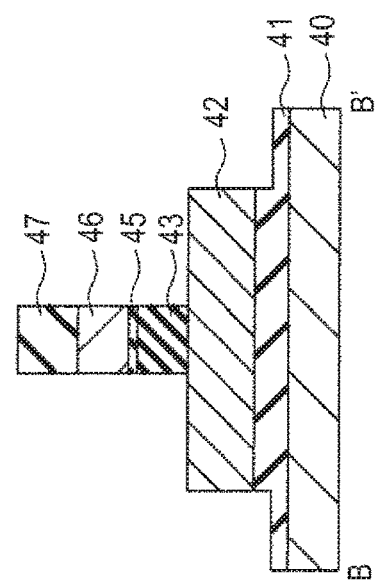
FIG. 17A is a plan view showing a manufacturing process in the manufacturing method of the semiconductor device according to the third embodiment of the present disclosure.
Figure 17B:
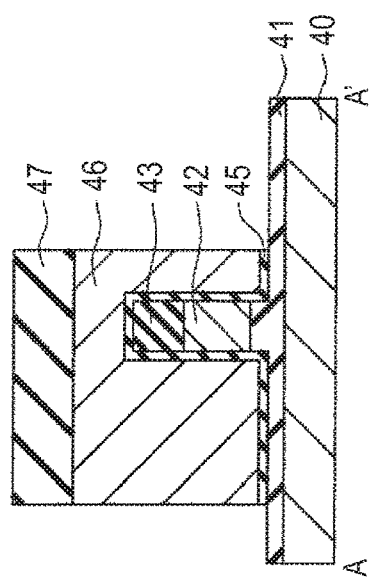
FIG. 17B is a schematic cross-sectional view taken along A-A' in FIG. 17A
Figure 17C:
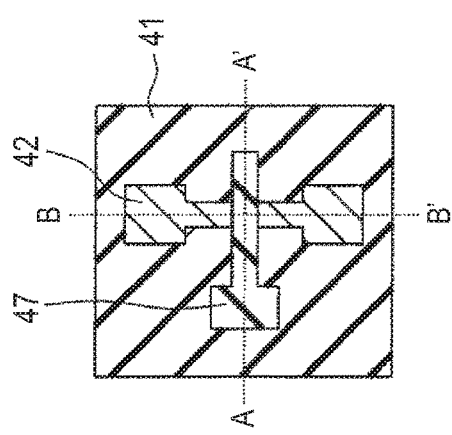
FIG. 17C is a schematic cross-sectional view taken along B-B' in FIG. 17A.

FIG. 17A is a plan view showing a process subsequent to the process shown in FIGS. 16A to 16C, FIG. 17B is a schematic cross-sectional view taken along A-A' in FIG. 17A and FIG. 17C is a schematic cross-sectional view taken along B-B' in FIG. 17A.

After removing the resist film 48, etching processing is performed to the gate electrode 46 and the gate insulating film 45 by using the first stress application layer 47 as a mask by the dry etching method.

It is also preferable to leave the resist film 48 and to use the film as a mask for the etching of the first stress application layer 47, the gate electrode 46 and the gate insulating film 45.

Figure 18A:
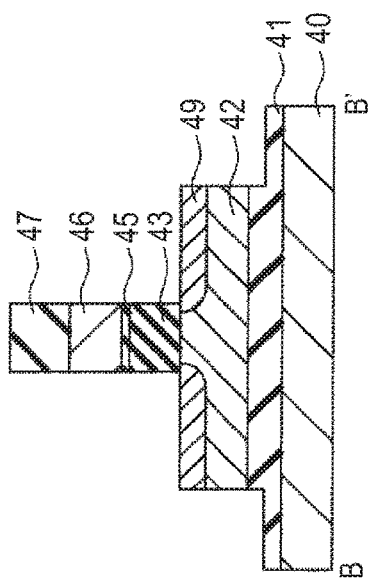
FIG. 18A is a plan view showing a manufacturing process in the manufacturing method of the semiconductor device according to the third embodiment of the present disclosure.
Figure 18B:
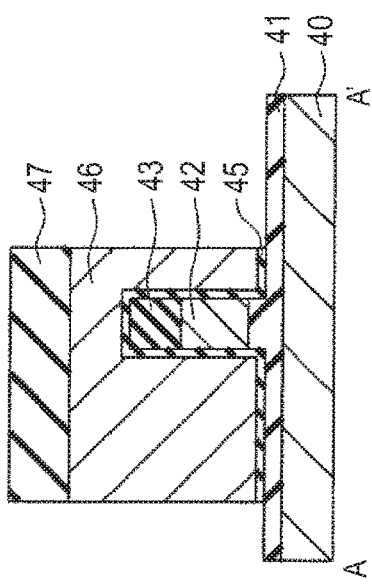
FIG. 18B is a schematic cross-sectional view taken along A-A' in FIG. 18A
Figure 18C:
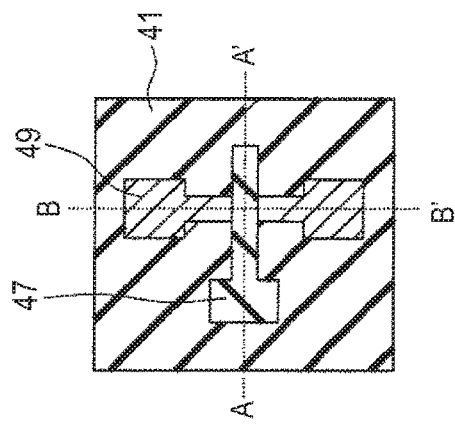
FIG. 18C is a schematic cross-sectional view taken along B-B' in FIG. 18A.

FIG. 18A is a plan view showing a process subsequent to the process shown in FIGS. 17A to 17C, FIG. 18B is a schematic cross-sectional view taken along A-A' in FIG. 18A and FIG. 18C is a schematic cross-sectional view taken along B-B' in FIG. 18A.

An extension region 49 is formed within the fin-type semiconductor region 42 by using an ion implantation method.

To the extension region 49, an n-type impurity is implanted in the case of the NTr and a p-type impurity is implanted in the case of the PTr.

Furthermore, it is also preferable in some cases that an impurity having different conductivity type from the extension region 49 is implanted deeper than the extension region 49. In this case, an impurity profile of the extension region 49 in the depth direction can be sharper.

Figure 19C:
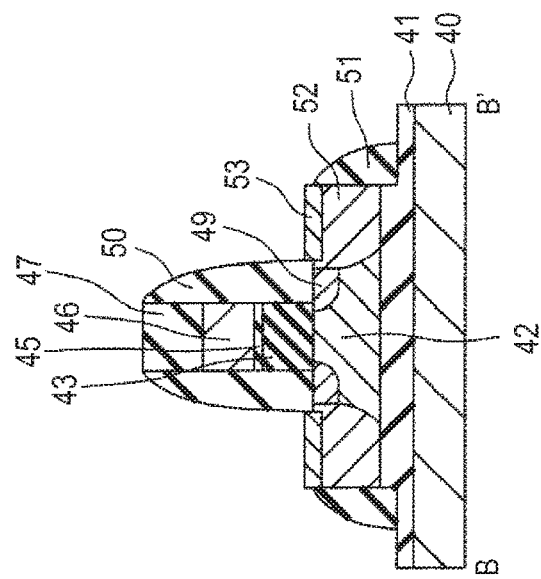
FIG. 19C is a schematic cross-sectional view taken along B-B' in FIG. 19A.
Figure 19B:
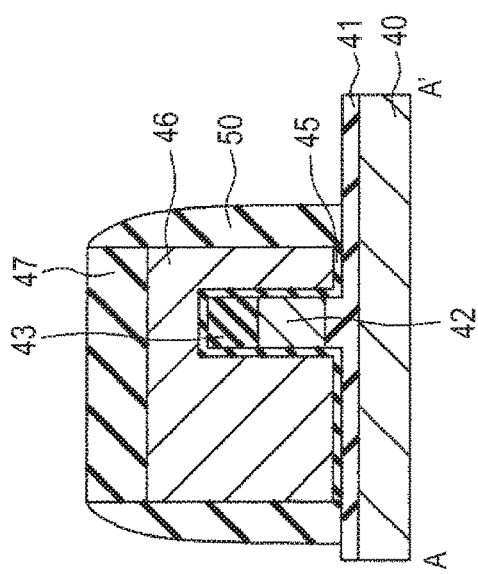
FIG. 19B is a schematic cross-sectional view taken along A-A' in FIG. 19A
Figure 19A:
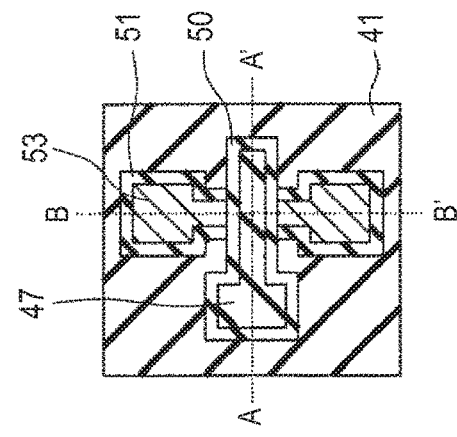
FIG. 19A is a plan view showing a manufacturing process in the manufacturing method of the semiconductor device according to the third embodiment of the present disclosure.

FIG. 19A is a plan view showing a process subsequent to the process shown in FIGS. 18A to 18C, FIG. 19B is a schematic cross-sectional view taken along A-A' in FIG. 19A and FIG. 19C is a schematic cross-sectional view taken along B-B' in FIG. 19A.

After forming an insulating film on the whole surface of the semiconductor substrate, recess-etching is performed by using the dry etching method to thereby form the sidewall insulating films 50, 51 at sidewalls of the gate insulating film 45, the gate electrode 46 and the first stress application layer 47.

The sidewall insulating films 50, 51 can be formed by using, for example, the silicon nitride film, the TEOS film, the NSG film and the silicon oxide film to have thicknesses of approximately 20 to 100 nm by the CVD method and so on.

The sidewall insulating films 50, 51 are respectively formed in the single layer in the embodiment, however, they can be formed by stacking plural films.

After that, a source/drain region 52 is formed in a depth reaching the vicinity of the upper surface of the buried insulating film 41 so as to be connected to the extension region 49 by using the ion implantation method.

The source/drain region 52 is formed by using the impurity of the same type as the extension region 49.

After that, the impurity implanted into the extension region 49 and the source/drain region 52 is activated by annealing. The activation annealing treatment is performed by, for example, rapid thermal annealing at approximately 1000 to 1100° C.

Next, a high-melting point metal silicide layer 53 is formed on the surface of the source/drain region 52 by using the salicide process technology. The film is formed by using, for example, Ti, Co, Ni, Pt or compounds of these materials to have a thickness of approximately 20 to 70 nm.

FIG. 20A is a plan view showing a process subsequent to the process shown in FIGS. 19A to 19C, FIG. 20B is a schematic cross-sectional view taken along A-A' in FIG. 20A and FIG. 20C is a schematic cross-sectional view taken along B-B' in FIG. 20A.

The second stress application layer 54 is formed on the whole surface of the substrate by, for example, the CVD method. The second stress application layer 54 is formed by using, for example, silicon nitride to have a thickness of approximately 200 to 300 nm, which has tensile stress of compression stress of approximately 1.5 to 2.0 GPa according to the channel type of the fin-type MOSFET.

The film having the stress which is different from the first stress application layer 47 is formed.

FIG. 21A is a plan view showing a process subsequent to the process shown in FIGS. 20A to 20C, FIG. 21B is a schematic cross-sectional view taken along A-A' in FIG. 21A and FIG. 21C is a schematic cross-sectional view taken along B-B' in FIG. 21A.

The second stress application layer 54 is removed by, for example, the CMP method so that the upper surface portion of the first stress application layer 47 is exposed.

According to the above process, the device has a structure in which the second stress application layer 54 is cut at both sides of the first stress application layer 47.

The semiconductor device having the structure shown in FIGS. 12A to 12C according to the embodiment can be manufactured in the manner described above.

As subsequent processes, an interlayer insulating film is deposited on the whole substrate, contact holes reaching the source/drain region and the gate electrode are opened and plugs are formed by being buried therein. The upper wiring is formed if necessary.

In the manufacturing method of the semiconductor device according to the embodiment of the present disclosure, combination of stresses to be applied is adjusted by forming the first and second stress application layer, thereby improving carrier mobility as compared with the related art examples.

6. Fourth Embodiment

[Structure of a Semiconductor Device]

Figure 22A:
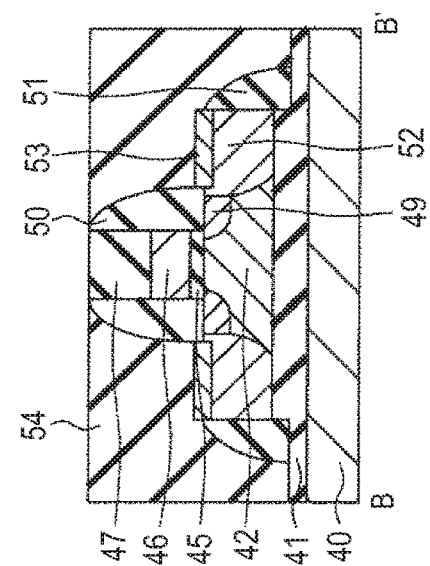
FIG. 22A is a plan view of a semiconductor device according to a fourth embodiment of the present disclosure.
Figure 22B:
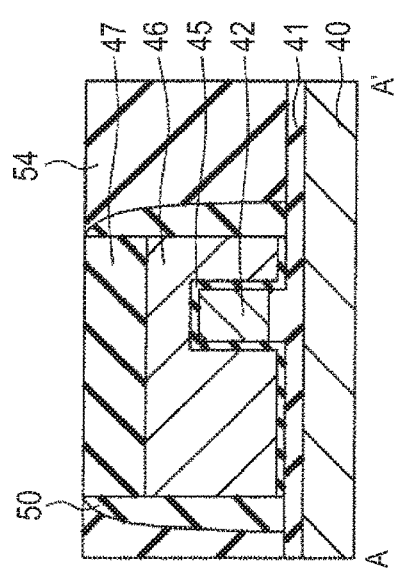
FIG. 22B is a schematic cross-sectional view taken along A-A' in FIG. 22A
Figure 22C:
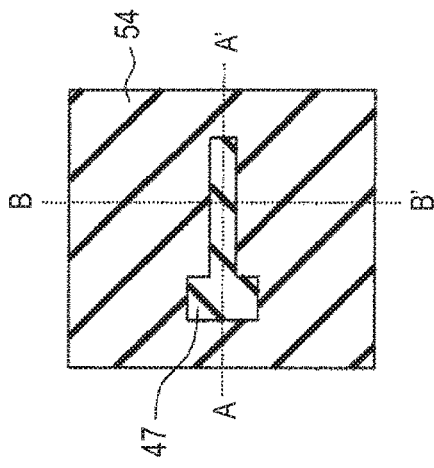
FIG. 22C is a schematic cross-sectional view taken along B-B' in FIG. 22A.

FIG. 22A is a plan view of a semiconductor device according to the embodiment, FIG. 22B is a schematic cross-sectional view taken along A-A' in FIG. 22A and FIG. 22C is a schematic cross-sectional view taken along B-B' in FIG. 21A.

The device has substantially the same structure as the third embodiment but is different in the following points.

The hard mask 43 in the semiconductor device of the third embodiment is removed. Accordingly, the fin-type film forming region is sandwiched by a triple-gate electrode.

The MOSFEET of the semiconductor device according to the embodiment is the fin-type MOSFET.

In the semiconductor device according to the embodiment, combination of stresses to be applied is adjusted by using the first and second stress application layer applying different stresses to the channel forming region, thereby improving carrier mobility as compared with the related art examples.

[Manufacturing Method of the Semiconductor Device]

A manufacturing method of the semiconductor device according to the embodiment will be explained with reference to FIGS. 23A to 23C to FIGS. 30A to 30C.

FIG. 23A is a plan view showing a manufacturing process in the manufacturing method of the semiconductor device according to the embodiment, FIG. 23B is a schematic cross-sectional view taken along A-A' in FIG. 23A and FIG. 23C is a schematic cross-sectional view taken along B-B' in FIG. 23A.

The hard mask 43 is deposited on a SOI (Silicon On Insulator) substrate having three-layer structure of the semiconductor substrate 40, the buried insulation film 41 and the semiconductor region 42. After that, a resist film 44 is formed by using the photolithography technique or the electron-beam lithography technique.

Next, etching is performed by using the resist film 44 as a mask by the dry etching method and so on to perform pattern etching of the hard mask 43.

At this time, for example, the silicon substrate is used as the semiconductor substrate 40 and silicon oxide having a thickness of approximately 50 to 100 nm is used as the buried insulating film 41.

Additionally, a silicon layer having a thickness of 30 to 80 nm is used as the semiconductor region 42. As the hard mask 43, for example, silicon nitride having a film thickness of approximately 50 nm is used.

FIG. 24A is a plan view showing a process subsequent to the process shown in FIGS. 23A to 23C, FIG. 24B is a schematic cross-sectional view taken along A-A' in FIG. 24A and FIG. 24C is a schematic cross-sectional view taken along B-B' in FIG. 24A.

After removing the resist film 44, the semiconductor region 42 is etched by dry etching processing by using the hard mask 43.

At this time, part of the buried insulating film 41 is etched at the same time to thereby form a structure in which the buried insulating film 41 is recessed at end portions of the fin-type semiconductor region 42.

According to the above, the fin-type semiconductor region 42 has a convex shape protruding from the main surface of the semiconductor substrate 40.

Additionally, the hard mask 43 is etched by dry etching or wet etching processing.

Figure 25A:
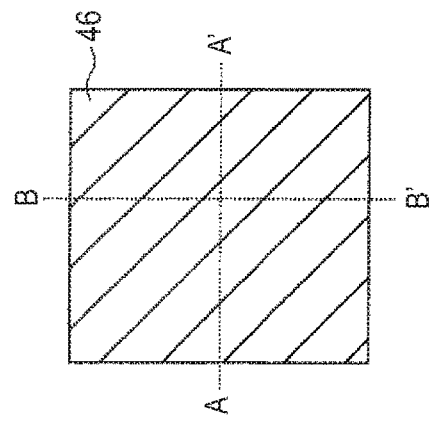
FIG. 25A is a plan view showing a manufacturing process in the manufacturing method of the semiconductor device according to the third embodiment of the present disclosure.
Figure 25B:
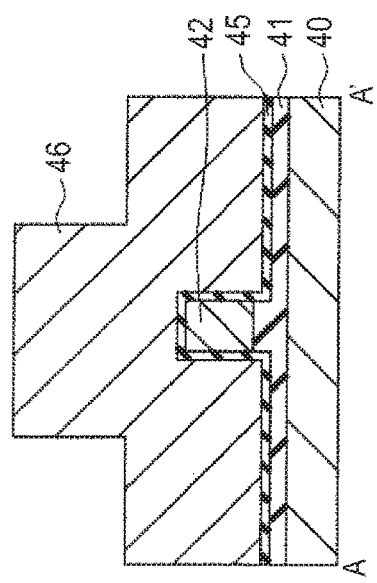
FIG. 25B is a schematic cross-sectional view taken along A-A' in FIG. 25A
Figure 25C:
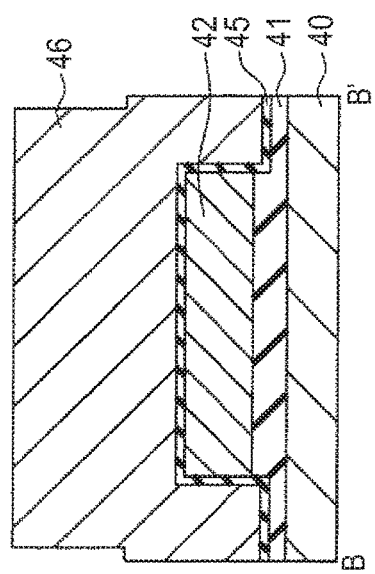
FIG. 25C is a schematic cross-sectional view taken along B-B' in FIG. 25A.

FIG. 25A is a plan view showing a process subsequent to the process shown in FIGS. 24A to 24C, FIG. 25B is a schematic cross-sectional view taken along A-A' in FIG. 25A and FIG. 25C is a schematic cross-sectional view taken along B-B' in FIG. 25A.

The gate insulating film 45 and the gate electrode 46 are deposited on the whole surface of the semiconductor substrate 40.

FIG. 26A is a plan view showing a process subsequent to the process shown in FIGS. 25A to 25C, FIG. 26B is a schematic cross-sectional view taken along A-A' in FIG. 26A and FIG. 26C is a schematic cross-sectional view taken along B-B' in FIG. 26A.

The CMP processing is performed to the gate electrode 46 from the upper surface of the gate electrode 46 to be a given thickness.

Next, after forming the first stress application layer 47 on the gate electrode 46, the resist film 48 is formed by the photolithography technique or the electron-beam lithography technique.

The first stress application layer 47 is etched by performing etching processing such as the dry etching method using the resist film 48 as a mask.

Figure 27A:
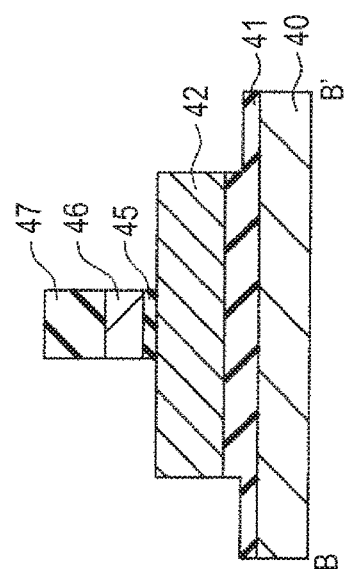
FIG. 27A is a plan view showing a manufacturing process in the manufacturing method of the semiconductor device according to the third embodiment of the present disclosure.
Figure 27B:
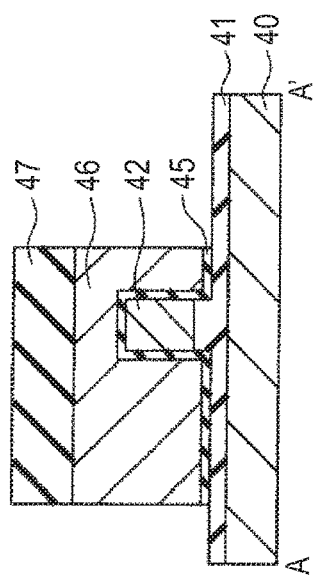
FIG. 27B is a schematic cross-sectional view taken along A-A' in FIG. 27A
Figure 27C:
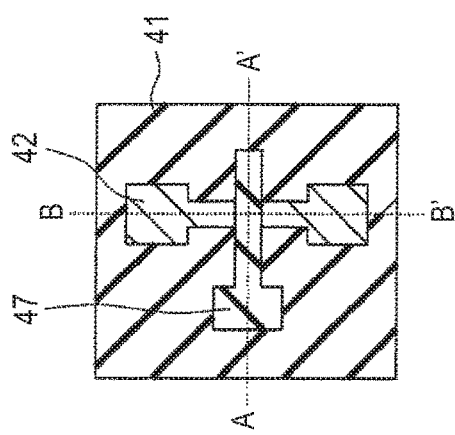
FIG. 27C is a schematic cross-sectional view taken along B-B' in FIG. 27A.

FIG. 27A is a plan view showing a process subsequent to the process shown in FIGS. 26A to 26C, FIG. 27B is a schematic cross-sectional view taken along A-A' in FIG. 27A and FIG. 27C is a schematic cross-sectional view taken along B-B' in FIG. 27A.

After removing the resist film 48, etching processing is performed by using the first stress application layer 47 as a mask by the dry etching method and so on to perform etching of the gate electrode 46 and the gate insulating film 45.

Figure 28A:
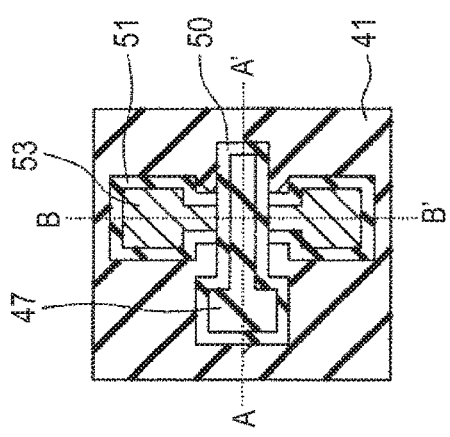
FIG. 28A is a plan view showing a manufacturing process in the manufacturing method of the semiconductor device according to the third embodiment of the present disclosure.
Figure 28B:
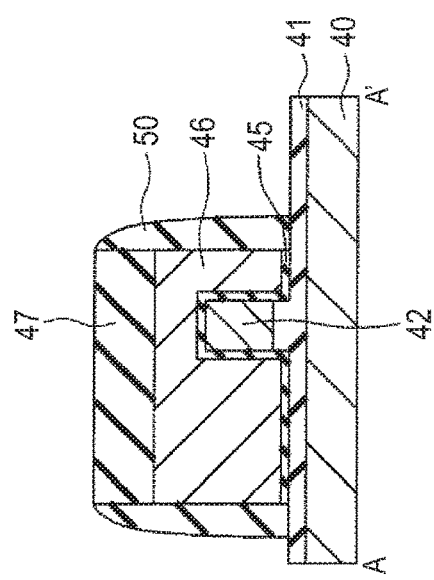
FIG. 28B is a schematic cross-sectional view taken along A-A' in FIG. 28A
Figure 28C:
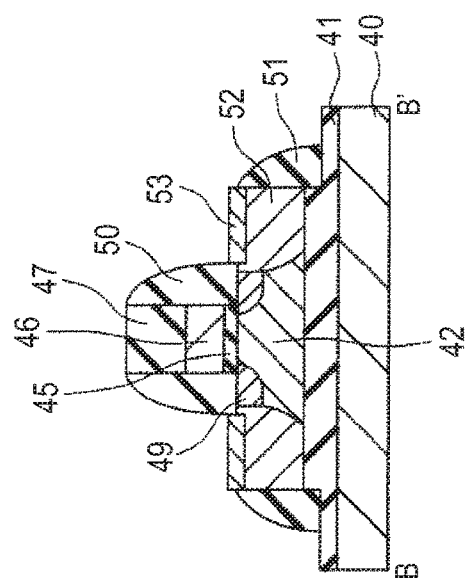
FIG. 28C is a schematic cross-sectional view taken along B-B' in FIG. 28A.

FIG. 28A is a plan view showing a process subsequent to the process shown in FIGS. 27A to 27C, FIG. 28B is a schematic cross-sectional view taken along A-A' in FIG. 28A and FIG. 28C is a schematic cross-sectional view taken along B-B' in FIG. 28A.

The extension region 49 is formed in the fin-type semiconductor region 42 by using the ion implantation method. Next, the sidewall insulating films 50, 51 are formed at sidewalls of the gate insulating film 45, the gate electrode 46 and the first stress application layer 47.

After that, the source/drain region 52 is formed in a depth reaching the vicinity of the upper surface of the buried insulating film 41 so as to be connected to the extension region 49 by using the ion implantation method.

Next, a high-melting point metal silicide layer 53 is formed on the surface of the source/drain region 52 by using the salicide process technology.

FIG. 29A is a plan view showing a process subsequent to the process shown in FIGS. 28A to 28C, FIG. 29B is a schematic cross-sectional view taken along A-A' in FIG. 29A and FIG. 29C is a schematic cross-sectional view taken along B-B' in FIG. 29A.

A second stress application layer 54 is formed on the whole substrate by using, for example, the CVD method.

Figure 30C:
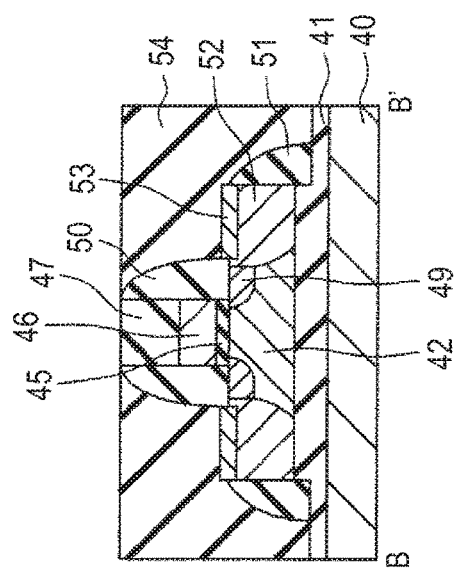
FIG. 30C is a schematic cross-sectional view taken along B-B' in FIG. 30A.
Figure 30B:
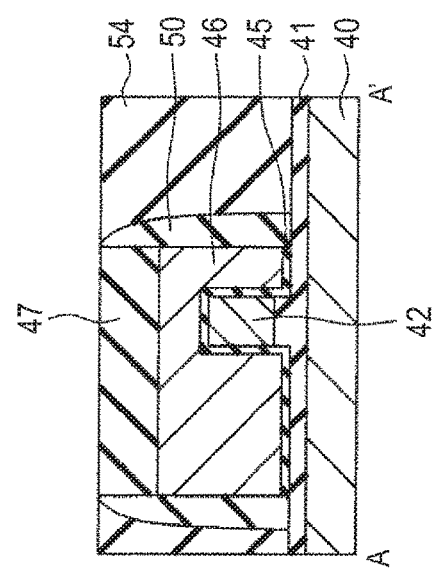
FIG. 30B is a schematic cross-sectional view taken along A-A' in FIG. 30A
Figure 30A:
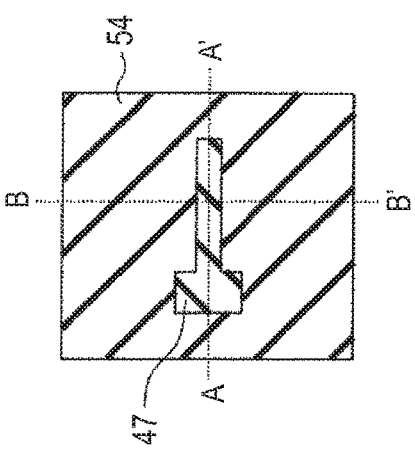
FIG. 30A is a plan view showing a manufacturing process in the manufacturing method of the semiconductor device according to the third embodiment of the present disclosure.
Figure 31:
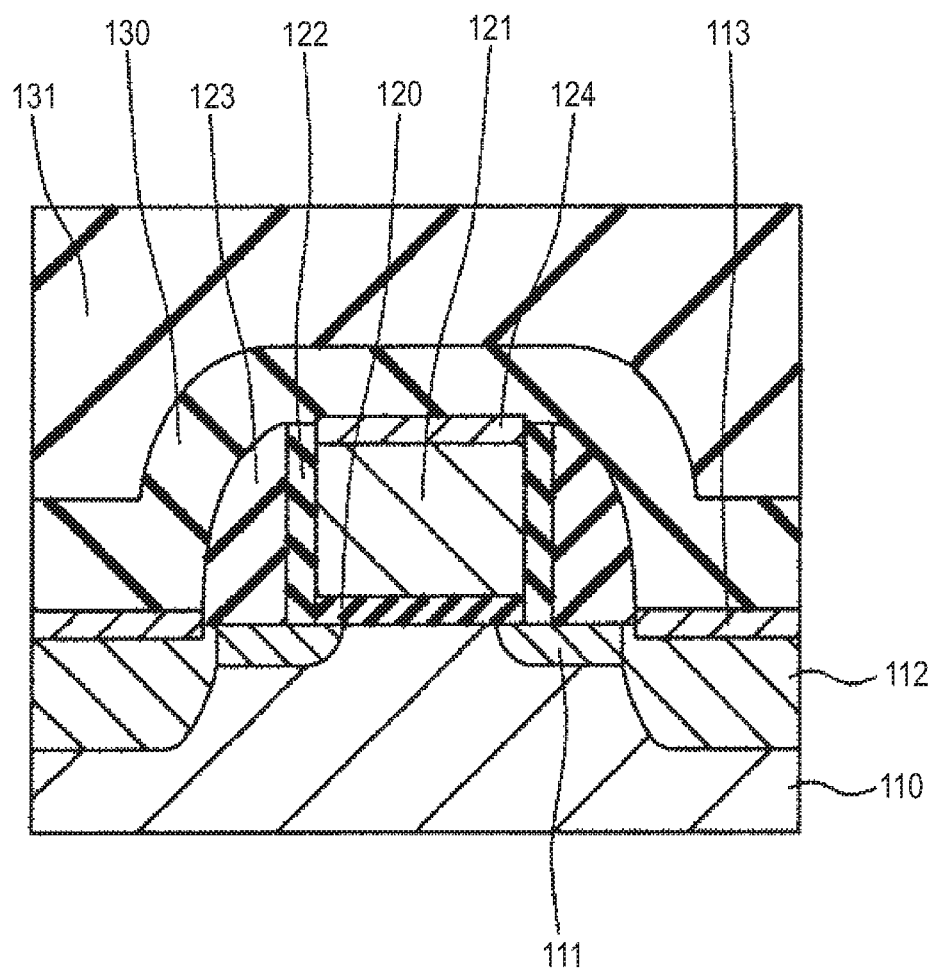
FIG. 31 is a cross-sectional view of a planar-type MOSFET according to a related art example.
Figure 32:
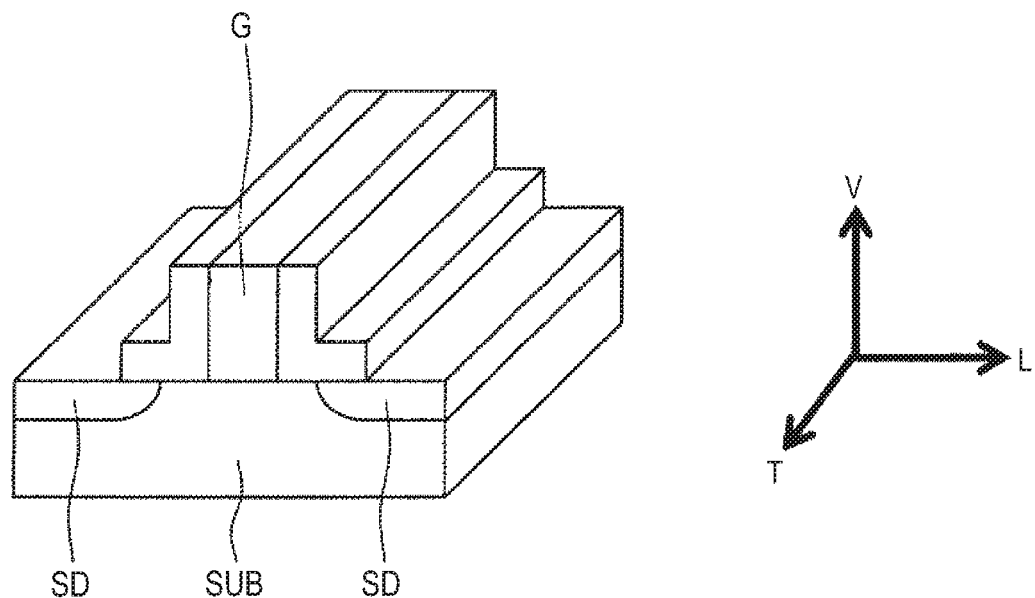
FIG. 32 is schematic perspective view showing a direction of stress in a channel forming region of the planar-type MOSFET.
Figure 33:
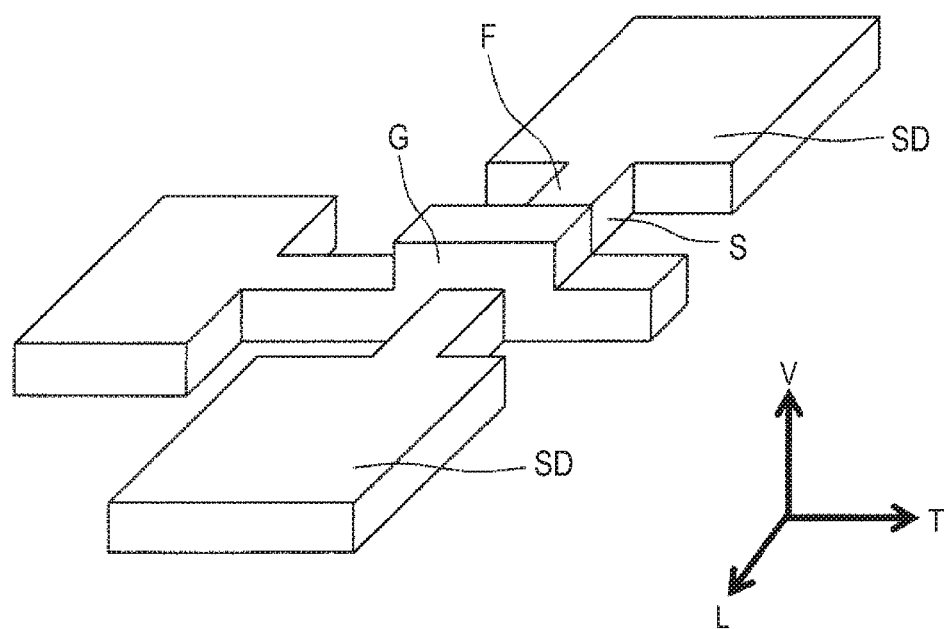
FIG. 33 is schematic perspective view showing a direction of stress in a channel forming region of a fin-type MOSFET.

FIG. 30A is a plan view showing a process subsequent to the process shown in FIGS. 29A to 29C, FIG. 30B is a schematic cross-sectional view taken along A-A' in FIG. 30A and FIG. 30C is a schematic cross-sectional view taken along B-B' in FIG. 30A.

The second stress application layer 54 is removed so that the upper surface portion of the first stress application layer 47 is exposed by using, for example, the CMP method.

According to the above process, the device has a structure in which the second stress application layer 54 is cut at both sides of the first stress application layer 47.

The semiconductor device having the structure shown in FIGS. 22A to 22C according to the embodiment can be manufactured in the manner described above.

As subsequent processes, an interlayer insulating film is deposited on the whole substrate, contact holes reaching the source/drain region and the gate electrode are opened and plugs are formed by being buried therein. The upper wiring is formed if necessary.

In the manufacturing method of the semiconductor device according to the embodiment of the present disclosure, combination of stresses to be applied is adjusted by forming the first and second stress application layer, thereby improving carrier mobility as compared with the related art examples.

In the semiconductor device and the manufacturing method thereof according to the embodiments, the first stress application layer is arranged on the gate electrode and the second stress application layer is formed in a region where the gate electrode and the first stress application layer are not formed on the semiconductor substrate.

According to the above, the device has the structure in which the second stress application layer is cut at both ends of the gate electrode. Therefore, stress can be applied to the semiconductor substrate at end portions of the gate electrode effectively.

Additionally, as the device has the structure in which the second stress application layer is cut off, the film thickness of the second stress application layer can be increased by adjusting the film thickness of the first stress application layer even when the gate electrode material is made to be thinner. As the result, the stress to be applied from the second stress application layer to the channel forming region is prevented from being alleviated.

Additionally, the first stress application layer and the second stress application layer use materials having different stresses, thereby applying different stresses in the gate length direction of the gate electrode and in the direction vertical to the substrate.

According to the above structure, the optimum stress application can be performing according to the FET structure, the channel type, the plane direction of the substrate and the channel direction, as a result, the effect of improving carrier mobility can be increased.

The present disclosure is not limited to the above description.

For example, the semiconductor device including the NTr or the PTr are explained in the above embodiments, however, it is not limited to this, and the technology can be applied to a CMOS structure having the both transistors.

Other various modifications may occur within the scope not departing from the gist of the present disclosure.

The present disclosure contains subject matter related to that disclosed in Japanese Priority Patent Application JP 2010-178976 filed in the Japan Patent Office on Aug. 9, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device including a field effect transistor comprising:
   a semiconductor substrate including a channel forming region;
   a gate insulating film formed at the channel forming region and formed at least partially on a first insulating film;
   a gate electrode formed over the gate insulating film, wherein the gate insulating film extends in a first direction along one or more sidewall surfaces of the gate electrode and extends in a second direction which intersects with a source-drain direction that is different than the first direction, between and along another surface of the gate electrode and a surface of the first insulating film;
   a first silicon nitride insulating layer formed over the gate electrode;
   a source/drain region formed on the semiconductor substrate; and a second silicon nitride insulating layer formed over the source/drain region in a region other than at least a region of the first silicon nitride insulating layer, wherein the field effect transistor is a fin-type field effect transistor, wherein an upper surface of the first silicon nitride insulating layer and an upper surface of the second silicon nitride insulating layer are in the same plane, wherein the gate insulating film makes contact with a first sidewall insulating film and a second sidewall insulating film in the second direction, and wherein a distance from an inner sidewall of the first sidewall insulating film to the channel forming region is different from a distance from an inner sidewall of the second sidewall insulating film to the channel forming region in the second direction.

2. The semiconductor device according to claim 1, wherein the source/drain region is formed from a mixed crystal layer including silicon and atoms different in lattice constant from silicon.

3. The semiconductor device according to claim 2, wherein the mixed crystal layer comprises silicon and germanium.

4. The semiconductor device according to claim 3, wherein the first silicon nitride insulating layer is a first stress application layer, and the second silicon nitride insulating layer is a second stress application layer.

5. The semiconductor device according to claim 4, wherein the first stress application layer applies a first stress to the channel forming region and the second stress application layer applies a second stress to the channel forming region, and a direction of the first stress is different from a direction of the second stress.

6. The semiconductor device according to claim 1, wherein the first region forms a concave shape for receiving the gate electrode.

7. The semiconductor device according to claim 1, wherein the gate electrode makes contact with the first sidewall insulating film and the second sidewall insulating film in the second direction.

8. The semiconductor device according to claim 1, wherein the first sidewall insulating film and the second sidewall insulating film surround the gate electrode.

9. The semiconductor device according to claim 1, wherein
the gate insulating film is formed to include a first side surface, a second side surface, and a bottom surface, the first and second side surfaces extending in the first direction and the bottom surface extending in the source-drain direction, the first and second side surfaces and the bottom surface forming a first region, and
the gate electrode is formed in the first region over the bottom surface.

10. The semiconductor device according to claim 9, wherein the first silicon nitride insulating layer makes contact with the first sidewall insulating film and the second sidewall insulating film in the second direction.

11. The semiconductor device according to claim 9, wherein the first sidewall insulating film and the second sidewall insulating film surround the gate electrode.

12. The semiconductor device according to claim 1, wherein the first silicon nitride insulating layer makes contact with the first sidewall insulating film and the second sidewall insulating film in the second direction.

13. A semiconductor device including a field effect transistor comprising:
a semiconductor substrate including a fin shape channel forming region;
a gate insulating film formed at the fin shape channel forming region and formed at least partially on a first insulating film;
a gate electrode formed over the gate insulating film,
wherein a first portion of the gate insulating film comprises a first region that extends along a first direction which intersects with a source-drain direction of the fin shape channel forming region, and a second portion of the gate insulating film comprises another region other than the first region, the another region extending in the first direction;
a first silicon nitride insulating layer formed over the gate electrode;
a source/drain region formed on the semiconductor substrate; and
a second silicon nitride insulating layer formed over the source/drain region at a region other than at least a region of the first silicon nitride insulating layer,
wherein the field effect transistor is a fin-type field effect transistor,
wherein an upper surface of the first silicon nitride insulating layer and an upper surface of the second silicon nitride insulating layer are in the same plane,
wherein the gate insulating film makes contact with a first sidewall insulating film and a second sidewall insulating film in the first direction, and
wherein a distance from an inner sidewall of the first sidewall insulating film to the channel forming region is different from a distance from an inner sidewall of the second sidewall insulating film to the channel forming region in the first direction.

14. The semiconductor device according to claim 13, wherein the second region forms a concave shape for receiving the gate electrode.

15. The semiconductor device according to claim 13, wherein the gate electrode makes contact with the first sidewall insulating film and the second sidewall insulating film in the first direction.

16. The semiconductor device according to claim 13, wherein the first sidewall insulating film and the second sidewall insulating film surround the gate electrode.

17. The semiconductor device according to claim 13, wherein
the gate insulating film is formed to include a first side surface, a second side surface, and a bottom surface, the first and second side surfaces extending in the first direction and the bottom surface extending in the source-drain direction, the first and second side surfaces and the bottom surface forming a first region, and
the gate electrode is formed in the first region over the bottom surface.

18. The semiconductor device according to claim 17, wherein the first silicon nitride insulating layer makes contact with the first sidewall insulating film and the second sidewall insulating film in the first direction.

19. The semiconductor device according to claim 17, wherein the first sidewall insulating film and the second sidewall insulating film surround the gate electrode.

20. The semiconductor device according to claim 13, wherein the first silicon nitride insulating layer makes contact with the first sidewall insulating film and the second sidewall insulating film in the first direction.

21. A semiconductor device including a field effect transistor comprising:
- a semiconductor substrate including a fin shape channel forming region;
- a gate insulating film formed at the channel forming region and formed at least partially on a first insulating film;
- a gate electrode formed over the gate insulating film, wherein the gate insulating film includes a first portion that extends along a first direction which intersects with a source-drain direction and along a second direction protruding from the semiconductor substrate, and a second portion that extends from the first portion in the first direction between the gate electrode and the first insulating film;
- a first silicon nitride insulating layer formed over the gate electrode;
- a source/drain region formed on the semiconductor substrate; and
- a second silicon nitride insulating layer formed over the source/drain region in a region other than at least a region of the first silicon nitride insulating layer,
- wherein the field effect transistor is a fin-type field effect transistor,
- wherein an upper surface of the first silicon nitride insulating layer and an upper surface of the second silicon nitride insulating layer are in the same plane,
- wherein the gate insulating film makes contact with a first sidewall insulating film and a second sidewall insulating film in the first direction, and
- wherein a distance from an inner sidewall of the first sidewall insulating film to the channel forming region is different from a distance from an inner sidewall of the second sidewall insulating film to the channel forming region in the first direction.

22. The semiconductor device according to claim 21, wherein the first region forms a concave shape for receiving the gate electrode.

23. The semiconductor device according to claim 21, wherein the gate electrode makes contact with the first sidewall insulating film and the second sidewall insulating film in the first direction.

24. The semiconductor device according to claim 21, wherein the first sidewall insulating film and the second sidewall insulating film surround the gate electrode.

25. The semiconductor device according to claim 21, wherein
- the gate insulating film is formed to include a first side surface, a second side surface, and a bottom surface, the first and second side surfaces extending in the first direction and the bottom surface extending in the source-drain direction, the first and second side surfaces and the bottom surface forming a first region, and
- the gate electrode is formed in the first region over the bottom surface.

26. The semiconductor device according to claim 25, wherein the first silicon nitride insulating layer makes contact with the first sidewall insulating film and the second sidewall insulating film in the first direction.

27. The semiconductor device according to claim 25, wherein the first sidewall insulating film and the second sidewall insulating film surround the gate electrode.

28. The semiconductor device according to claim 21, wherein the first silicon nitride insulating layer makes contact with the first sidewall insulating film and the second sidewall insulating film in the first direction.

29. A semiconductor device including a field effect transistor comprising:
- a semiconductor substrate including a channel forming region;
- a gate insulating film formed to include a first side surface, a second side surface and a bottom surface, the first and second side surfaces extending in a first direction, and the bottom surface extending in a source-drain direction, the first and second side surfaces and the bottom surface forming a first region;
- a gate electrode formed in the first region over the bottom surface;
- a first silicon nitride insulating layer formed over the gate electrode;
- a source/drain region formed on the semiconductor substrate; and
- a second silicon nitride insulating layer formed in a second region other than the first region,
- wherein the field effect transistor is a fin-type field effect transistor,
- wherein an upper surface of the first silicon nitride insulating layer and an upper surface of the second silicon nitride insulating layer are in the same plane,
- wherein the gate insulating film makes contact with a first sidewall insulating film and a second sidewall insulating film in a second direction which intersects with the source-drain direction, and
- wherein a distance from an inner sidewall of the first sidewall insulating film to the channel forming region is different from a distance from an inner sidewall of the second sidewall insulating film to the channel forming region in the second direction.

30. The semiconductor device according to claim 29, wherein the first region forms a concave shape for receiving the gate electrode.

31. The semiconductor device according to claim 29, wherein the first sidewall insulating film and the second sidewall insulating film surround the gate electrode.

32. The semiconductor device according to claim 29, wherein the first silicon nitride insulating layer makes contact with the first sidewall insulating film and the second sidewall insulating film in the second direction.

* * * * *